United States Patent
Kurita

(10) Patent No.: US 10,049,972 B2
(45) Date of Patent: Aug. 14, 2018

(54) WIRING BOARD, ELECTRONIC COMPONENT DEVICE, METHOD FOR MANUFACTURING WIRING BOARD, AND METHOD FOR MANUFACTURING ELECTRONIC COMPONENT DEVICE

(71) Applicant: SHINKO ELECTRIC INDUSTRIES CO., LTD., Nagano-shi, Nagano (JP)

(72) Inventor: Kentaro Kurita, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 225 days.

(21) Appl. No.: 14/940,033

(22) Filed: Nov. 12, 2015

(65) Prior Publication Data
US 2016/0141236 A1 May 19, 2016

(30) Foreign Application Priority Data

Nov. 17, 2014 (JP) .................................. 2014-232507

(51) Int. Cl.
*H01L 23/49* (2006.01)
*H01L 21/48* (2006.01)
(Continued)

(52) U.S. Cl.
CPC .... *H01L 23/49822* (2013.01); *H01L 21/4857* (2013.01); *H01L 23/5389* (2013.01);
(Continued)

(58) Field of Classification Search
CPC ........... H01L 23/49822; H01L 21/4857; H01L 23/5389; H01L 23/49816; H01L 2224/16225; H01L 2224/32225; H01L 2224/73204; H01L 2924/15311; H05K 3/381; H05K 3/4644; H05K 2201/09781;
(Continued)

(56) References Cited

U.S. PATENT DOCUMENTS 6,097,089 A * 8/2000 Gaku .................... H01L 21/481
257/675
2006/0003495 A1* 1/2006 Sunohara ............ H01L 21/4857
438/124
(Continued)

FOREIGN PATENT DOCUMENTS

JP 2006-019441 1/2006
JP 2006-140360 6/2006
(Continued)

OTHER PUBLICATIONS

Japanese Office Action with English Translation dated May 15, 2018, 8 pages.

*Primary Examiner* — Michael P McFadden
(74) *Attorney, Agent, or Firm* — Rankin, Hill & Clark LLP

(57) ABSTRACT

A wiring board includes a first wiring layer, an insulating layer, and a pad. The insulating layer is formed on the first wiring layer. The pad is formed on the insulating layer in a region where the insulating layer overlaps the first wiring layer in a plan view. The pad includes a pad body and plural protrusion portions. The protrusion portions protrude from the pad body toward a lower side of the pad body. The protrusion portions are embedded in the insulating layer. The protrusion portions are separate from the first wiring layer.

12 Claims, 22 Drawing Sheets

(51) Int. Cl.
  *H01L 23/538* (2006.01)
  *H05K 1/18* (2006.01)
  *H01L 23/498* (2006.01)
  *H05K 3/38* (2006.01)
  *H05K 3/46* (2006.01)

(52) U.S. Cl.
  CPC ........ *H05K 1/185* (2013.01); *H01L 23/49816* (2013.01); *H01L 2224/16225* (2013.01); *H01L 2224/32225* (2013.01); *H01L 2224/73204* (2013.01); *H01L 2924/15311* (2013.01); *H05K 3/381* (2013.01); *H05K 3/4644* (2013.01); *H05K 2201/09781* (2013.01); *H05K 2201/10674* (2013.01); *H05K 2201/2072* (2013.01); *H05K 2203/107* (2013.01); *H05K 2203/1469* (2013.01)

(58) Field of Classification Search
  CPC . H05K 2201/10674; H05K 2201/2071; H05K 2203/107; H05K 2203/1469; H05K 1/185
  USPC ......................................................... 361/761
  See application file for complete search history.

(56) References Cited

U.S. PATENT DOCUMENTS

| | | | |
|---|---|---|---|
| 2009/0215231 A1 | 8/2009 | Inoue | |
| 2009/0272562 A1* | 11/2009 | Yoshioka | H05K 1/162 |
| | | | 174/250 |
| 2010/0032196 A1* | 2/2010 | Kaneko | H01L 21/4846 |
| | | | 174/260 |
| 2010/0071950 A1* | 3/2010 | Ohsumi | H01L 23/49811 |
| | | | 174/261 |
| 2012/0227261 A1* | 9/2012 | Inui | H05K 1/186 |
| | | | 29/849 |
| 2012/0319254 A1* | 12/2012 | Kikuchi | H01L 23/5389 |
| | | | 257/659 |

FOREIGN PATENT DOCUMENTS

| | | |
|---|---|---|
| JP | 2009-200389 | 9/2009 |
| JP | 2009-224461 | 10/2009 |
| JP | 2012-191204 | 10/2012 |
| JP | 2013-211426 | 10/2013 |
| JP | 2014-116548 | 6/2014 |

* cited by examiner

Power distribution of laser beam

WIRING BOARD, ELECTRONIC COMPONENT DEVICE, METHOD FOR MANUFACTURING WIRING BOARD, AND METHOD FOR MANUFACTURING ELECTRONIC COMPONENT DEVICE

CROSS-REFERENCE TO RELATED APPLICATION(S)

This application claims priority from Japanese Patent Application No. 2014-232507, filed on Nov. 17, 2014, the entire contents of which are herein incorporated by reference.

BACKGROUND

Field

Exemplary embodiments of the invention relate to a wiring board, an electronic component device, a method for manufacturing a wiring board, and a method for manufacturing an electronic component device.

Related Art

In accordance with recent development of electronic apparatuses, there is a demand for size reduction, high performance and the like in a wiring board of an electronic component device that is to be used in an electronic apparatus. In order to address this demand, an electronic component built-in wiring board in which electronic components are incorporated in the wiring board has been practically used.

SUMMARY

As will be described in preliminary matters later, when an opening is formed by a laser in an insulating layer on an electronic-component mounting pad, thermal damages due to the laser is easily accumulated in the electronic-component mounting pad.

In the case where heat history is further given in a subsequent step, therefore, a defect may occur such that a portion, where a connection via is not formed, of the electronic-component mounting pad which has been thermally damaged separates from the underlying insulating layer.

One exemplary embodiment of the invention improves the reliability of a pad in a wiring board and electronic component device in which an electronic component is mounted on the pad in an opening of an insulating layer, and methods for manufacturing the wiring board and the electronic component device.

According to one exemplary embodiment, a wiring board includes a first wiring layer, an insulating layer, and a pad. The insulating layer is formed on the first wiring layer. The pad is formed on the insulating layer in a region where the insulating layer overlaps the first wiring layer in a plan view. The pad includes a pad body and plural protrusion portions. The protrusion portions protrude from the pad body toward a lower side of the pad body. The protrusion portions are embedded in the insulating layer. The protrusion portions are separate from the first wiring layer.

According to another exemplary embodiment, an electronic component device includes a first wiring layer, a first insulating layer, a pad, a second insulating layer, and an electronic component. The first insulating layer is formed on the first wiring layer. The pad is formed on the first insulating layer in a region where the insulating layer overlaps the first wiring layer in a plan view. The pad includes a pad body and plural protrusion portions. The protrusion portions protrude from the pad body toward a lower side of the pad body. The protrusion portions are embedded in the first insulating layer. The protrusion portions are separate from the first wiring layer. The second insulating layer is formed on the first insulating layer. The second insulating layer is formed with an opening on the pad. The electronic component is provided on the pad.

According to the following disclosure, in the wiring board, the pad to be mounted with an electronic component includes the protrusion portions on the lower side of the pad body. Therefore, the pad has a relatively large volume. As a result, in forming an opening by a laser in the insulating layer on the pad, it is possible to reduce thermal damage thermal damage which is caused by the laser and which is received by the pad.

Since the pad includes the protrusion portions, the pad is formed on the insulating layer with a high adhesion property provided by the anchor effect.

Therefore, in the case where heat treatment is performed in a subsequent step, it is prevented that the pad separates from the underlying insulating layer.

In the case where the opening of the insulating layer is deviated from the pad in the laser process, the frame-like protrusion portion is formed in the peripheral portion of the lower surface of the pad. Thereby, it is prevented that wet treatment peels off the pad.

DETAILED DESCRIPTION

Hereinafter, exemplary embodiments will be described in detail with reference to the accompanying drawings.

Before description is given on the exemplary embodiments, preliminary matters underlying one exemplary embodiment of the invention will be described. FIGS. 1A to 3B are views showing a method for manufacturing a wiring board according to the preliminary matters.

Figure 1A:
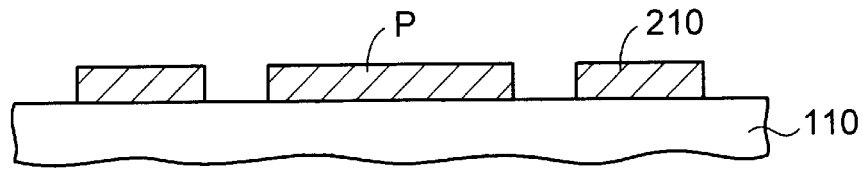
FIGS. 1A to 1D are section views (No. 1) showing a first issue in a method for manufacturing a wiring board according to preliminary matters.

As shown in FIG. 1A, at first, a wiring board being in process of manufacture is prepared. The wiring board has a structure that a first wiring layer 210 and an electronic-component mounting pad P are formed on a first insulating layer 110. The first wiring layer 210 and the electronic-component mounting pad P are made of copper (Cu) and are disposed on the same plane. It is noted that the term "plane" does not necessarily mean a physical plane or a surface of an actual layer, but may mean a virtual plane.

Figure 1B:
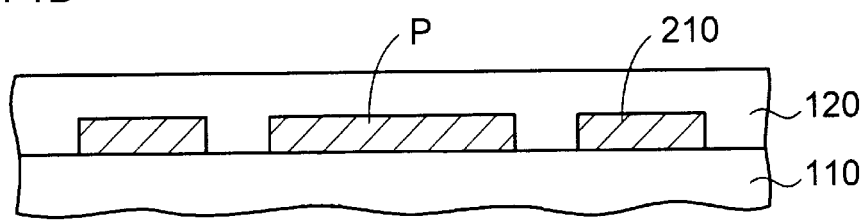

As shown in FIG. 1B, next, a second insulating layer 120 is formed on the first insulating layer 110. The second insulating layer 120 covers the first wiring layer 210 and the electronic-component mounting pad P.

Figure 1C:
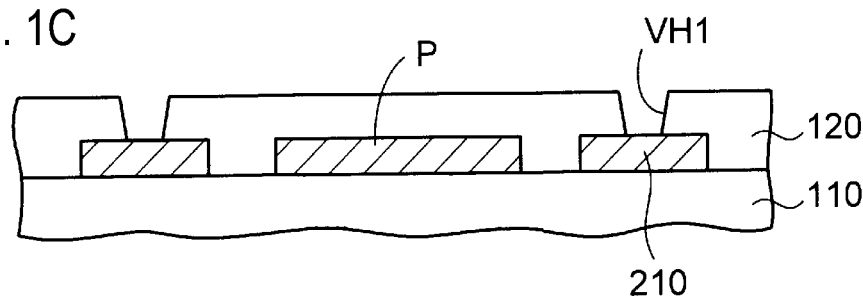

As shown in FIG. 1C, the second insulating layer 120 is processed with a laser, to thereby form first via holes VH1 so that the first via holes VH1 reach the first wiring layer 210.

Figure 1D:
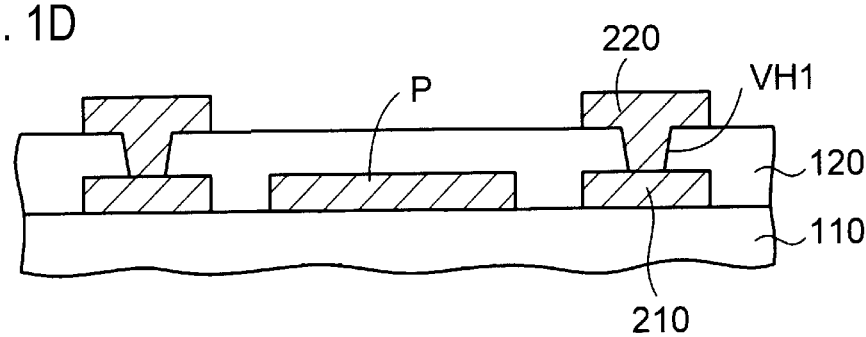

As shown in FIG. 1D, a second wiring layer 220 is formed on the second insulating layer 120. The second wiring layer 220 is connected to the first wiring layer 210 through the first via holes VH1.

Figure 2A:
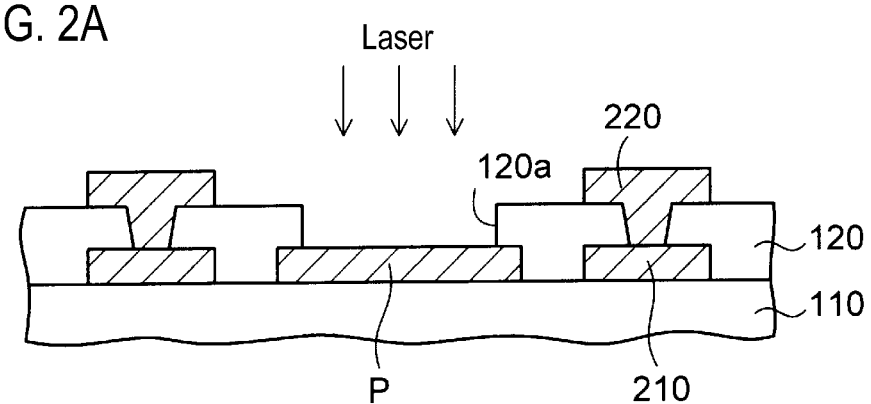
FIGS. 2A and 2B are section views (No. 2) showing the first issue in the method for manufacturing a wiring board related to the preliminary matters.

As shown in FIG. 2A, next, the second insulating layer 120 on the electronic-component mounting pad P is processed with a laser, to thereby form an opening 120a on the electronic-component mounting pad P. The electronic-component mounting pad P is not electrically connected to the other wiring layers, but is in an electrically floating state. A thickness of the electronic-component mounting pad P is relatively small, and is, for example, in a range of about 15 μm to about 20 μm.

Therefore, the electronic-component mounting pad P cannot completely absorb heat generated in the laser process, and is apt to accumulate thermal damage.

Figure 2B:
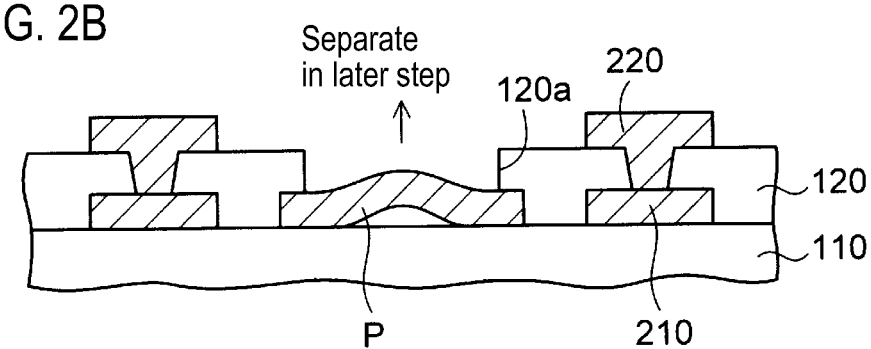

In this manner, the electronic-component mounting pad P is damaged by the heat in the laser process. Therefore, there arises a first issue, that is, when heat treatment is performed in a subsequent step and heat history is given to the wiring board, the thermally damaged electronic-component mounting pad P would separate from the underlying insulating layer 110 as shown in FIG. 2B.

Although not particularly shown, the step of performing the heat treatment is a step of mounting a first semiconductor chip on the electronic-component mounting pad P and connecting a second semiconductor chip, by reflow soldering, to the uppermost wiring layer that is connected to the first semiconductor chip. Alternatively, the step of performing the heat treatment is a step of connecting an electronic component device that is finally obtained to a mounting board such as a motherboard by reflow soldering.

Figure 3A:
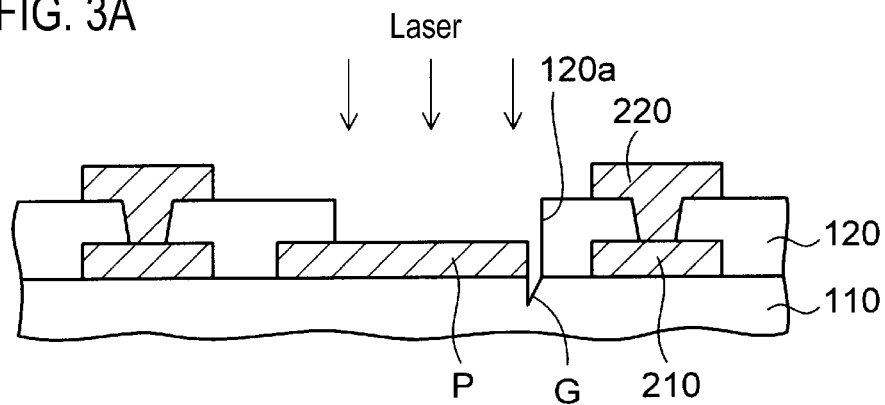
FIGS. 3A and 3B are section views showing a second issue in the method for manufacturing a wiring board related to the preliminary matters.
Figure 3B:
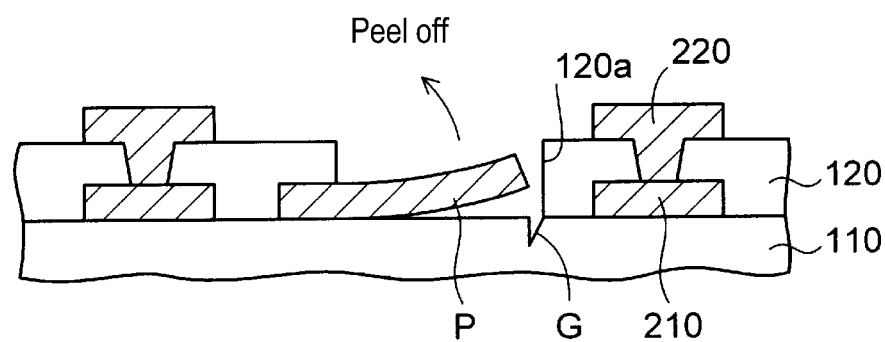

FIGS. 3A and 3B show a second issue of the preliminary matters. Because of high-density mounting, recently, there is a demand that a distance between a side surface of the electronic-component mounting pad P and a side wall of the opening 120a be narrowed to about 10 μm or less in design.

Therefore, there may be a case where in the process of forming the opening 120a by a laser in the second insulating layer 120 on the electronic-component mounting pad P, the side wall of the opening 120a is deviated toward an outside from the side surface of the electronic-component mounting pad P due to positional misalignment in the laser process as shown in FIG. 3A.

In the portion where the side wall of the opening 120a is deviated from the electronic-component mounting pad P, a groove G is formed by a laser in a region outside the side surface of the electronic-component mounting pad P and in a range from the second insulating layer 120 to the first insulating layer 110. Therefore, a lower end of the side surface of the electronic-component mounting pad P is exposed to an interior of the groove G.

If wet treatment such as desmear treatment is performed for the structure shown in FIG. 3A, treatment liquid may penetrate from the end of the lower surface of the electronic-component mounting pad P into the inner side, and the electronic-component mounting pad P may peel off from the first insulating layer 110 as shown in FIG. 3B.

A first exemplary embodiment which will be described later addresses the first issue. Also, a second exemplary embodiment which will be described later deals with the second issue.

(First Exemplary Embodiment)

FIGS. 4 to 16 are views showing a wiring board and electronic component device according to the first exemplary embodiment. Hereinafter, the structures of the wiring board and the electronic component device will be described while description is given on methods for manufacturing the wiring board and the electronic component device.

Figure 4:
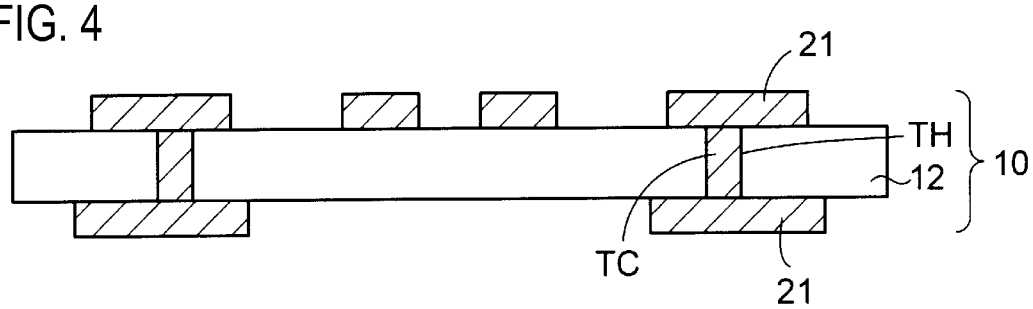
FIG. 4 is a section view (No. 1) showing a method for manufacturing a wiring board of a first exemplary embodiment.

In the method for manufacturing the wiring board of the first exemplary embodiment, firstly, a core board 10 having a structure shown in FIG. 4 is prepared. The core board 10 includes an insulating board 12 that is made from a glass epoxy resin or the like. The insulating board 12 is formed with through holes TH that pass through the insulating board 12 in a thickness direction thereof. The through holes TH are filled with through conductors TC.

First wiring layers 21 are formed on both surfaces of the core board 10, respectively. The first wiring layers 21 on the both surface sides are connected to each other through the through conductors TC.

Alternatively, through hole plating layers may be formed on side walls of the through holes TH. The remaining hole portions of the through holes TH may be filled with resin members.

The through holes TH of the core board 10 are formed by drilling or the like. Also, the first wiring layers 21 and the through conductors TC of the core board 10 are formed by using a plating method, photolithography, or the like.

Multilayer wiring layers are formed on the both surface sides of the core board 10 shown in FIG. 4. In the following description, how the multilayer wiring layer and the like are formed on the upper surface side of the core board 10 of FIG. 4 will be described and partially illustrated.

Figure 5A:
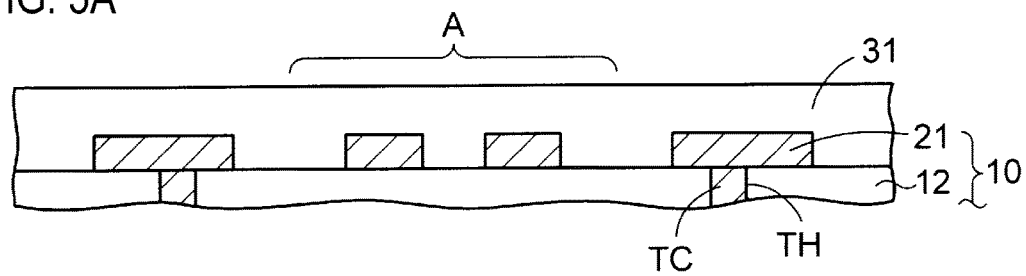
FIGS. 5A to 5C are section views (No. 2) showing the method for manufacturing the wiring board of the first exemplary embodiment.

FIG. 5A partially shows the first wiring layer 21 on the upper surface side of the core board 10 of FIG. 4. As shown in FIG. 5A, an uncured resin film is applied to the upper surface side of the core board 10. Then, the resin film is cured by heat treatment to form a first insulating layer 31. The first insulating layer 31 is made of an epoxy resin, a polyimide resin, or the like.

A die pad formation region "A" is defined on the first insulating layer 31. In the die pad formation region "A," an electronic-component mounting pad P will be provided.

A thickness of the first insulating layer 31 is in a range of about 20 μm to about 30 μm when measured from the upper surface of the first wiring layer 21.

Figure 5B:
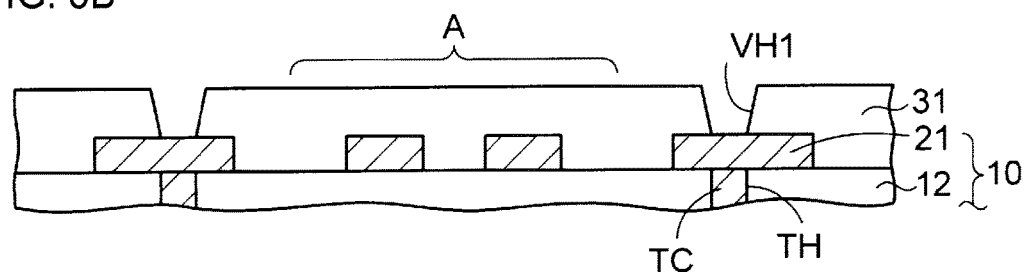

As shown in FIG. 5B, thereafter, the first insulating layer 31 on connecting portions of the first wiring layer 21 is processed with a laser, to thereby form first via holes VH1. The first via holes VH1 reach the first wiring layer 21.

Figure 5C:
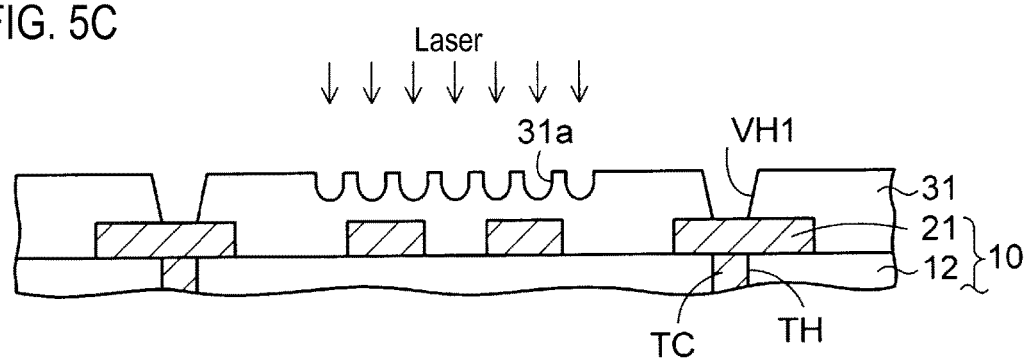

As shown in FIG. 5C, then, the first insulating layer 31 in the pad formation region "A" is processed with a laser. Thereby, plural hole-shaped recess portions 31a are formed in the upper surface of the first insulating layer 31 in a region that overlaps the first wiring layer 21 in a plan view. The plural recess portions 31a of the first insulating layer 31 are formed up to a midway point of the first insulating layer 31 in the thickness direction of the first insulating layer 31. The plural recess portions 31a do not reach the first wiring layer 21. The plural recess portions 31a are embedded in the first insulating layer 31.

Figure 5D:
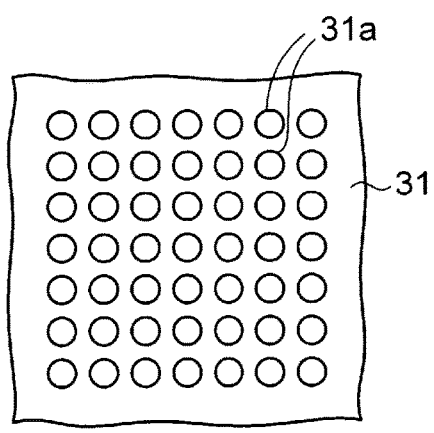
FIG. 5D is a partial plan view showing the structure of FIG. 5C when viewed from above.

Further referring to FIG. 5D which is a partial plan view, the plural recess portions 31a of the first insulating layer 31 are arranged in lateral directions (horizontal directions) so that the recess portions 31a are separated from each other at intervals to not connect to each other. The plural recess portions 31a of the first insulating layer 31 are arranged in a region having a rectangle shape in a plan view.

As will be described later, the recess portions 31a of the first insulating layer 31 are formed in order to provide plural protrusion portions Px in the electronic-component mounting pad P. The plural protrusion portions Px protrude from a pad body PB of the electronic-component mounting pad P toward a lower side of the pad body PB. Also, the plural protrusion portions Px do not reach the first wiring layer 21.

In this manner, a depth of the recess portions 31a is smaller than that of the first via holes VH1. Therefore, the laser power in a process of forming one recess portion 31a by the laser in the first insulating layer 31 is set to be smaller than that in the process of forming one first via hole VH1.

Alternatively, the number of laser shots in the process of forming one recess portion 31a by the laser in the first insulating layer 31 may be set to be smaller than that in the process of forming one first via hole VH1.

Examples of the laser include a $CO_2$ laser, an excimer laser, and the like. In the case where there is a demand for high accuracy in depth of the recess portions 31a, it is preferable to use the excimer laser. The excimer laser provides a high accuracy in depth that is obtained by a single shot of the excimer laser. Therefore, a recess having a target depth can be accurately formed.

For example, the recess portions 31a of the first insulating layer 31 have a diameter in a range of 50 μm to 60 μm. In the case where the thickness of the first insulating layer 31 is 20 μm when measured from the upper surface of the first wiring layer 21, the depth of the recess portions 31a of the first insulating layer 31 is in a range of about 10 μm to about 15 μm.

As described above, by adjusting the laser irradiation conditions in the step of forming the first via holes VH1 in the first insulating layer 31 by the laser, the plural recess portions 31a can be simultaneously formed in the pad formation region "A." Therefore, the recess portions 31a can be easily formed without introducing a new manufacturing apparatus or a special step.

Figure 6A:
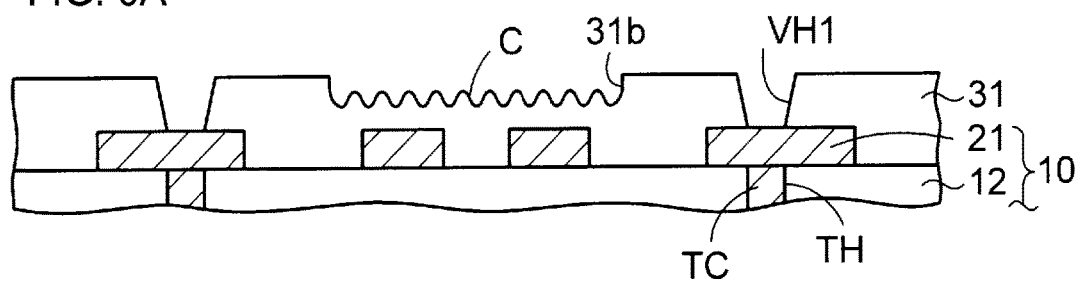
FIG. 6A is a section view (No. 3) showing the method for manufacturing the wiring board of the first exemplary embodiment.
Figure 6B:
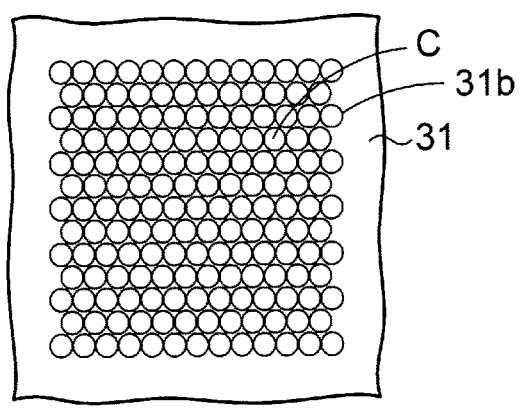
FIG. 6B is a partial plan view showing the structure of FIG. 6A when viewed from above.

According to another exemplary embodiment, as shown in FIGS. 6A and 6B, the plural recess portions 31a of the first insulating layer 31 shown in FIGS. 5C and 5D may be formed to be connected to each other in the lateral directions (horizontal directions). In this case, a single integrated recess portion 31b is formed in the first insulating layer 31 in the pad formation region "A." The recess portion 31b is embedded in the first insulating layer 31. Also, concavities and convexities (which are collectively indicated by a reference sign "C" in FIGS. 6A and 6B) are formed on a bottom surface of the recess portion 31b.

In the process of forming the recess portion 31b shown in FIGS. 6A and 6B, laser processes are sequentially performed in the lateral directions (horizontal directions) so that laser shots partially overlap each other. Thereby, plural shot portions are connected to each other to form the single integrated recess portion 31b. Also, bottoms of the shot portions remain as the concavities and convexities "C."

Figure 7A:
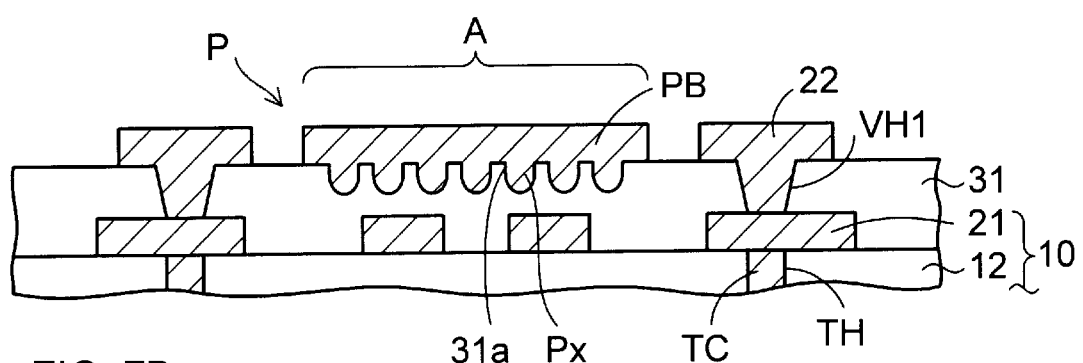
FIG. 7A is a section view (No. 4) showing the method for manufacturing the wiring board of the first exemplary embodiment.
Figure 7B:
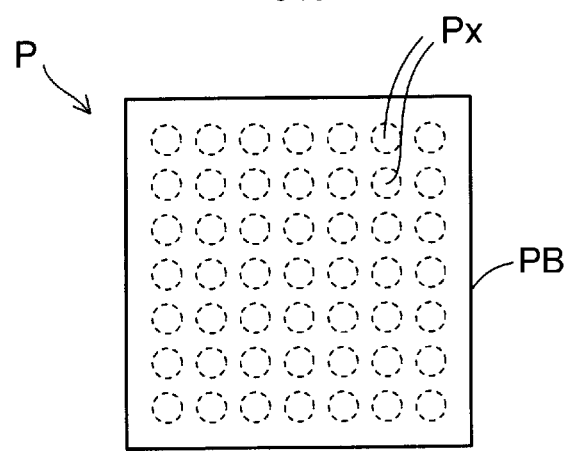
FIG. 7B is a partial plan view showing the structure of FIG. 7A when viewed from above.

Hereinafter, the method for manufacturing the wiring board by using the structure member shown in FIGS. 5C and 5D will be described. As shown in FIGS. 7A and 7B, a second wiring layer 22 is formed on the first insulating layer 31. The second wiring layer 22 is connected to the first wiring layer 21 through via conductors provided in the first via holes VH1. At the same time, the electronic-component mounting pad P is formed on the first insulating layer 31 in the pad formation region "A" in which the plural recess portions 31a are formed.

A method for forming the second wiring layer 22 and the electronic-component mounting pad P will be described in detail with reference to partially section views of FIGS. 8A to 8D. The second wiring layer 22 and the electronic-component mounting pad P are formed by a semi-additive process.

Figure 8A:
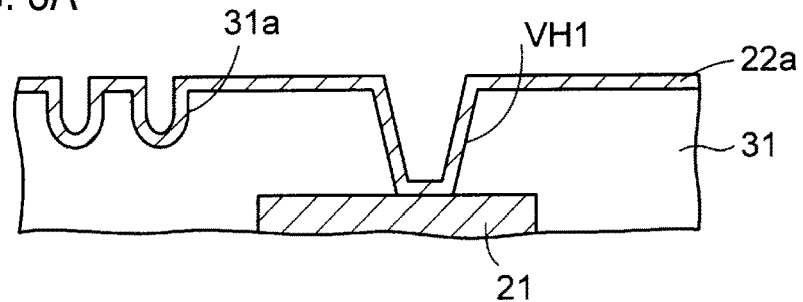
FIGS. 8A to 8D are section views (No. 5) showing the method for manufacturing the wiring board of the first exemplary embodiment.

As shown in FIG. 8A, firstly, a seed layer 22a is formed by an electroless plating process on the first insulating layer 31 and on the inner surfaces of the first via holes VH1 and the inner surfaces of the recess portions 31a. The seed layer 22a is made of copper or the like. Also, the seed layer 22a has a thickness of about 1 μm. Alternatively, the seed layer 22a may be formed by a sputtering process.

Figure 8B:
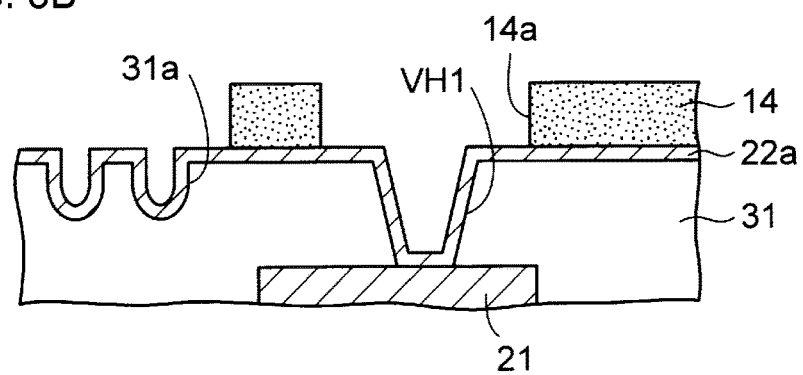

As shown in FIG. 8B, next, a plating resist layer 14 is formed. The plating resist layer 14 is formed with openings 14a in regions where the second wiring layer 22 and the electronic-component mounting pad P will be provided.

Figure 8C:
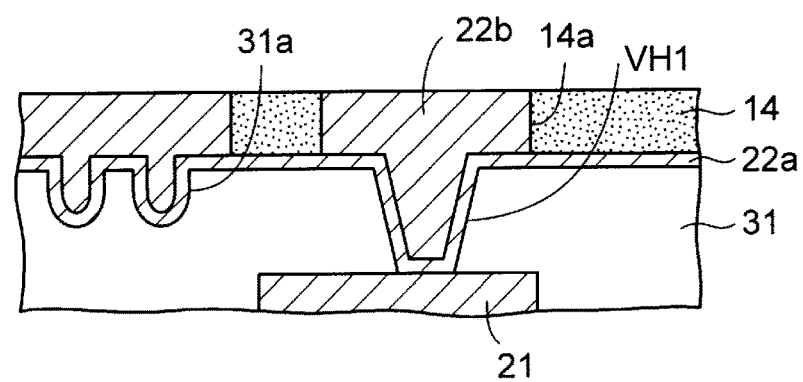

As shown in FIG. 8C, then, a metal plating layer 22b is formed in the openings 14a of the plating resist layer 14 by electrolytic plating. In the electrolytic plating, the seed layer 22a is used as a plating power supply path. The metal plating layer 22b is made of copper or the like The metal plating layer 22b is formed in the openings 14a of the plating resist layer 14 so as to fill the first via holes VH1 and the recess portions 31a. A thickness of the metal plating layer 22b is in a range of about 15 μm to about 20 μm.

Figure 8D:
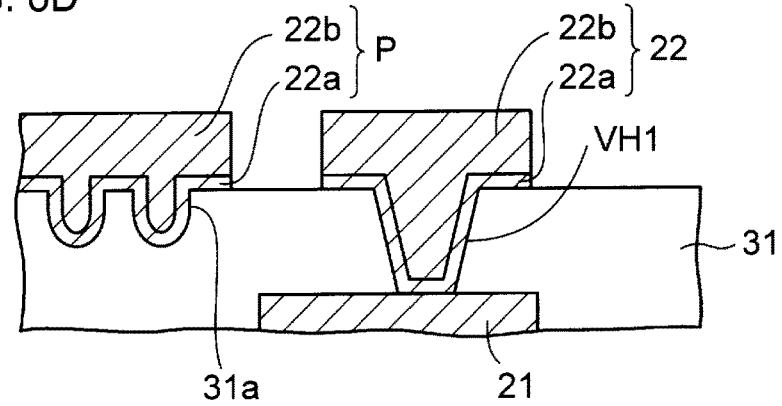

As shown in FIG. 8D, the plating resist layer 14 is removed. Then, the seed layer 22a is removed by wet etching while using the metal plating layer 22b as a mask.

As result, the second wiring layer 22 is formed. The second wiring layer 22 includes the seed layer 22a and the metal plating layer 22b. At the same time, the electronic-component mounting pad P is formed. The electronic-component mounting pad P includes the seed layer 22a and the metal plating layer 22b. In this manner, the electronic-component mounting pad P (particularly, the pad body PB) and the second wiring layer 22 are formed to be on the same plane.

In FIG. 7A, the second wiring layer 22 and the electronic-component mounting pad P are shown while the seed layer 22a and the metal plating layer 22b are omitted.

Further referring to FIG. 7B which is a partial plan view, the second wiring layer 22 is embedded in the plural recess portions 31a, which are arranged in the pad formation region "A" on the first insulating layer 31.

In this manner, the electronic-component mounting pad P is formed so as to include a pad body PB and plural protrusion portions Px. The pad body PB is located at the same plane as the second wiring layer 22 is. The protrusion portions Px protrude from the pad body PB toward a lower side of the pad body PB in the thickness direction of the first insulating layer 31. The protrusion portions Px of the electronic-component mounting pad P are formed so as to be separate from the first wiring layer 21.

With this configuration, a volume of the electronic-component mounting pad P having the protrusion portions Px is larger than that of the electronic-component mounting pad P not having the protrusion portions Px. Therefore, the electronic-component mounting pad P of the first exemplary embodiment is robust against thermal damage caused by a laser. Also, the electronic-component mounting pad P is provided with the plural protrusion portions Px, which protrudes from the pad body PB. The pad body PB and the protrusion portions Px are in contact with the first insulating layer 31. Therefore, a contact area between the electronic-component mounting pad P and the first insulating layer 31 can be increased.

In this manner, a strong anchor effect is obtained. Hence, the adhesion property between the electronic-component mounting pad P and the first insulating layer 31 can be enhanced.

Figure 9A:
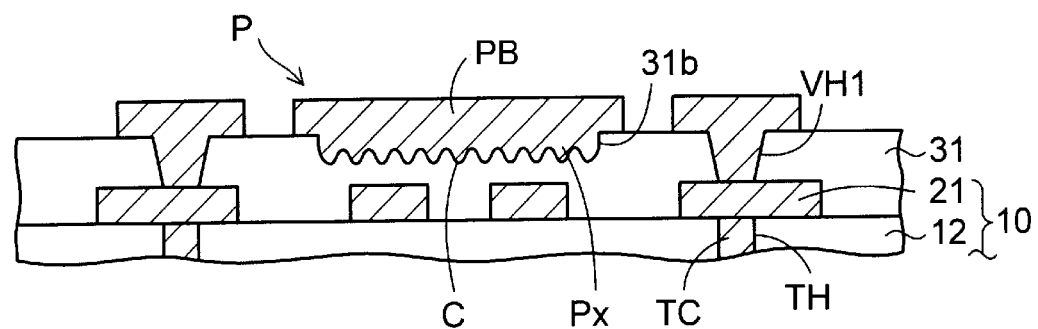
FIG. 9A is a section view (No. 6) showing the method for manufacturing the wiring board of the first exemplary embodiment.
Figure 9B:
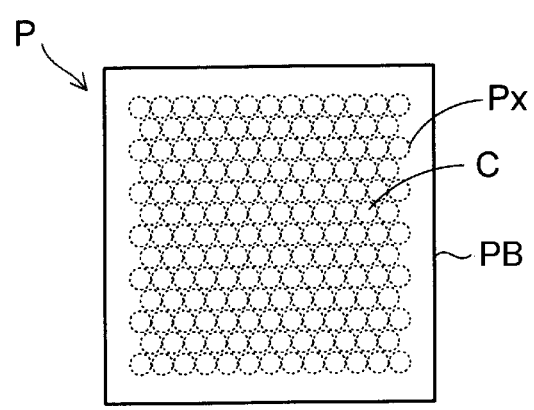
FIG. 9B is a partial plan view of the structure of FIG. 9A when viewed from above.

In the case where the single integrated recess portion 31b is formed in the first insulating layer 31 as shown in FIGS. 6A and 6B, the electronic-component mounting pad P is formed so as to fill the single integrated recess portion 31b. Thereby, an integrated protrusion portion Px is formed to protrude from the pad body PB toward the lower side of the pad body PB as shown in FIGS. 9A and 9B. In this case, a volume of the electronic-component mounting pad P is large. Therefore, the electronic-component mounting pad P is robust against thermal damage caused by a laser.

Similarly, the concavities and convexities C are formed on a lower surface of the integrated protrusion portion Px of the electronic-component mounting pad P. Therefore, the adhesion property between the electronic-component mounting pad P and the first insulating layer 31 can be enhanced by the anchor effect.

Figure 10A:
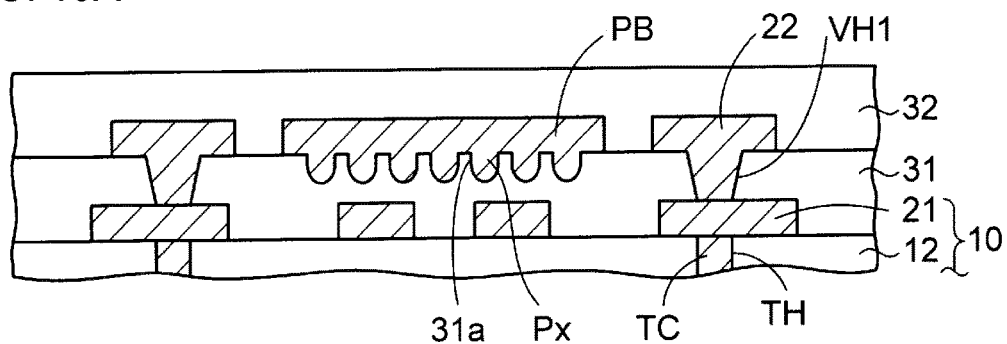
FIGS. 10A and 10B are section views (No. 7) showing the method for manufacturing the wiring board of the first exemplary embodiment.

As shown in FIG. 10A, then, a second insulating layer 32 is formed on the first insulating layer 31 by a method similar to the method for forming the first insulating layer 31 shown in FIG. 5A. The second insulating layer 32 covers the second wiring layer 22 and the electronic-component mounting pad P.

Figure 10B:
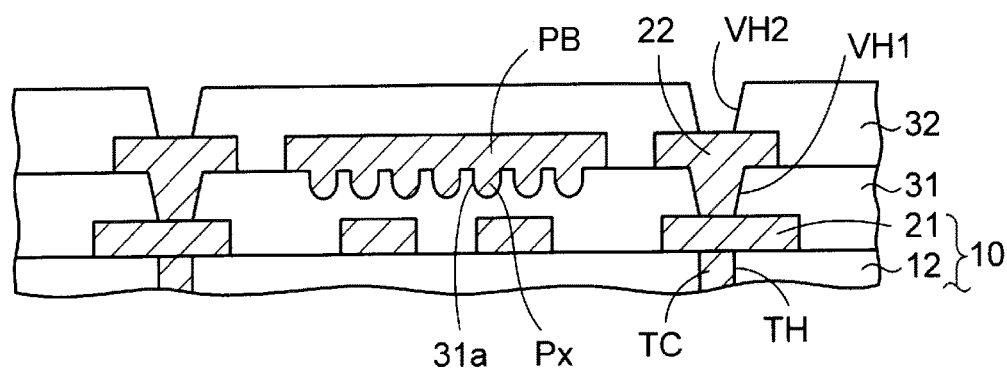

As shown in FIG. 10B, then, the second insulating layer 32 on connecting portions of the second wiring layer 22 is processed with a laser, to thereby form second via holes VH2. The second via holes VH2 reach the second wiring layer 22.

Figure 11A:
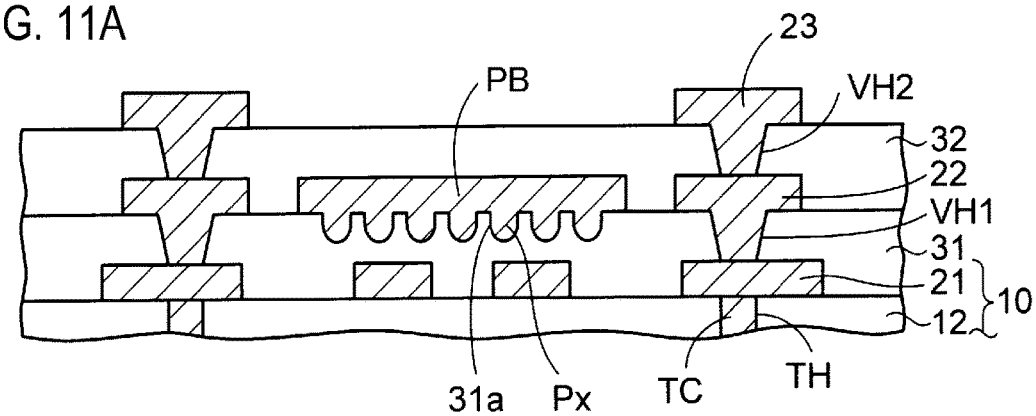
FIGS. 11A and 11B are section views (No. 8) showing the method for manufacturing the wiring board of the first exemplary embodiment.

As shown in FIG. 11A, then, a third wiring layer 23 is formed on the second insulating layer 32 by a semi-additive process similar to that described with reference to FIGS. 8A to 8D. The third wiring layer 23 is connected to the second wiring layer 22 through via conductors provided in the second via holes VH2.

Figure 11B:
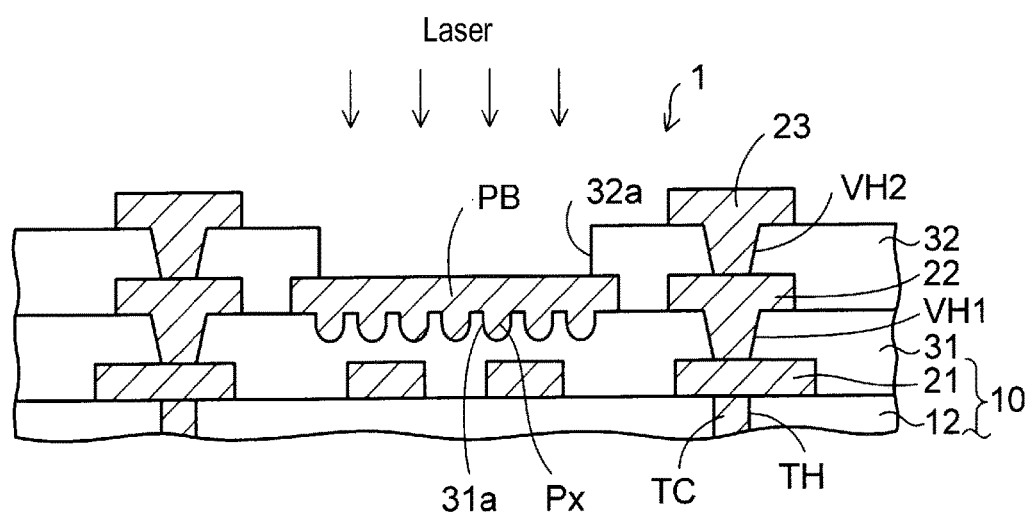

Furthermore, as shown in FIG. 11B, the second wiring layer 32 on the electronic-component mounting pad P is processed with a laser while using the electronic-component mounting pad P as a stopper. As a result, an opening 32a is formed in the second insulating layer 32 on the electronic-component mounting pad P. The opening 32a may be referred to as a "cavity."

At this time, the electronic-component mounting pad P includes the plural protrusion portions Px which protrude from the pad body PB as described above, as well as the pad body PB. Therefore, the electronic-component mounting pad P has a relatively large volume. As a result, an amount of heat of the laser which is received by a unit volume of the electronic-component mounting pad P is small. Consequently, thermal damage which is caused by the laser and which is received by the electronic-component mounting pad P can be reduced.

Since the protrusion portions Px are formed on the lower side of the pad body PB as described above, thermal damage which is so large as to cause separation in a subsequent step is hardly accumulated in the electronic-component mounting pad P.

Figure 11C:
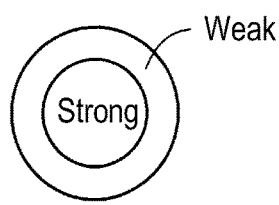
FIG. 11 C is a plan view schematically showing a power distribution of a laser beam

FIG. 11C schematically shows a power distribution of a laser beam. As shown in FIG. 11C, the power of the laser beam is strong in a central part thereof, and weak in a peripheral part thereof. In the electronic-component mounting pad P, portions where the protrusion portions Px are thicker than those where the protrusion portions Px are not provided.

When the second insulating layer 32 is processed with a laser, the portion of the electronic-component mounting pad P which is irradiated with the "STRONG" part of the laser beam suffers thermal damage which is larger than that given to the other portion. Hence, the portion of the electronic-component mounting pad P which is irradiated with the "STRONG" part of the laser beam is apt to induce the separation defect.

Therefore, in processing the second insulating layer 32 with the laser to form the opening 32a, it is preferable to perform this process so that the "STRONG" part of the laser beam corresponds to the positions where the protrusion portions Px of the electronic-component mounting pad P are provided.

Since the portions where the protrusion portions Px are formed are relatively thicker in the electronic-component mounting pad P, it is possible to reduce damage due to irradiation of the "STRONG" part of the laser beam. Therefore, a place which may induce the defect of separation of the electronic-component mounting pad P can be reduced. This is effective to prevent the separation defect from occurring.

As described above, in the process of forming the opening 32a by the laser in the second insulating layer 32 on the electronic-component mounting pad P, it is preferable that portions subject to the laser process include the portions which have been irradiated with the laser to form the above-described recess portions 31a shown in FIGS. 5C and 5D.

In the case where the single integrated recess portion 31b is formed in the first insulating layer 31 by the laser as shown in FIGS. 6A and 6B, the following is preferable in the process of forming the opening 32a in the second insulating layer 32. That is, the laser is applied to the same portions as those which have been irradiated with the laser when the recess portion 31b was formed.

As a result, the wiring board 1 of the first exemplary embodiment is obtained as shown in FIG. 11B. The wiring board 1 of the first exemplary embodiment has the structure that the electronic-component mounting pad P is exposed from the opening 32a of the second insulating layer 32. The electronic-component mounting pad P includes the plural protrusion portions Px on the lower side of the pad body PB.

Next, description will be given on the method for manufacturing the electronic component device by using the wiring board 1 of the first exemplary embodiment shown in FIG. 11B.

Figure 12A:
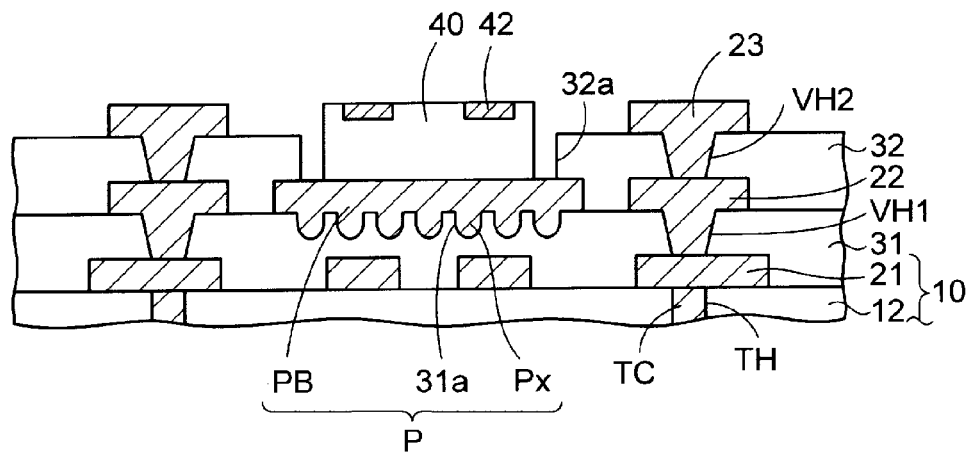
FIGS. 12A and 12B are section views (No. 1) showing a method for manufacturing an electronic component device by using the wiring board of FIG. 11B.

As shown in FIG. 12A, at first, a first semiconductor chip 40 is prepared as a first electronic component. The first semiconductor chip 40 includes connection terminals 42. While the connection terminals 42 are directed upward, a rear surface (lower surface) of the first semiconductor chip 40 is fixed onto the electronic-component mounting pad P by an adhesive agent (not shown).

Figure 12B:
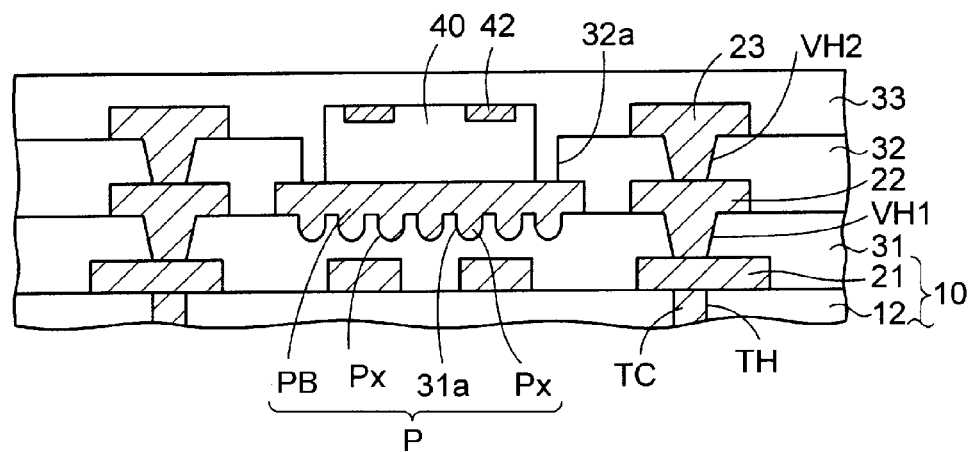

As shown in FIG. 12B, then, a third insulating layer 33 is formed on the second insulating layer 32 by a method similar to the method for forming the first insulating layer 31 shown in FIG. 5A. The third insulating layer 33 covers the third wiring layer 23 and the first semiconductor chip 40.

Figure 13A:
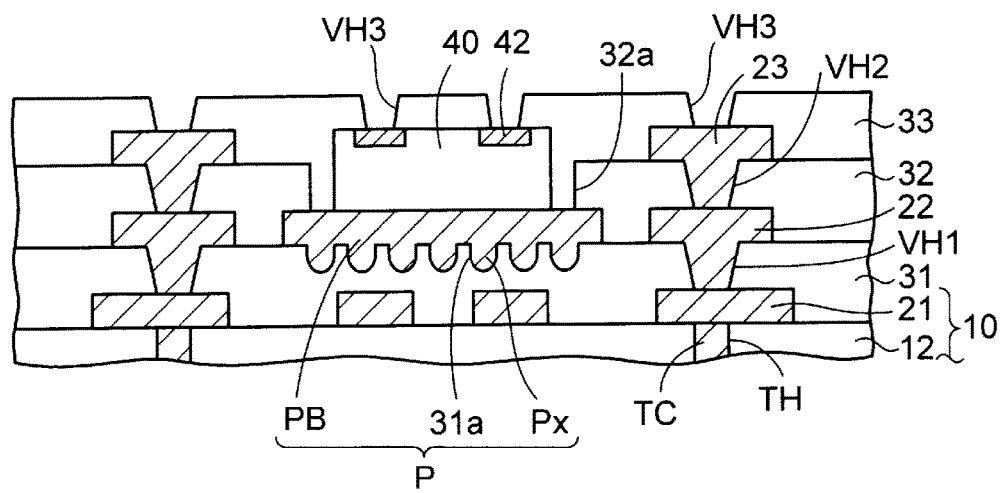
FIGS. 13A and 13B are section views (No. 2) showing the method for manufacturing the electronic component device by using the wiring board of FIG. 11B.

As shown in FIG. 13A, then, the third insulating layer 33 is processed with a laser, to thereby form third via holes VH3. The third via holes VH3 reach the third wiring layer 23 and the connection terminals 42 of the first semiconductor chip 40.

Figure 13B:
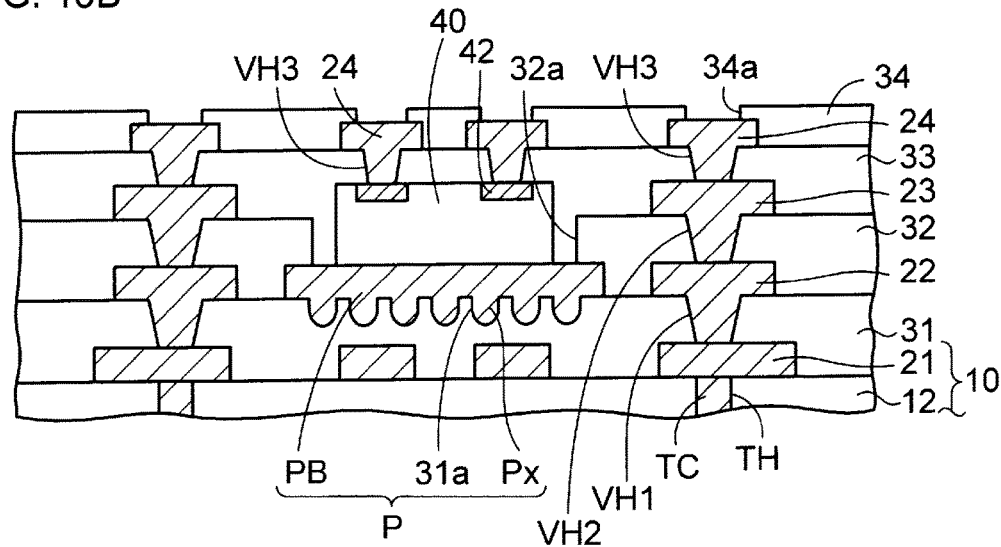

As shown in FIG. 13B, then, a fourth wiring layer 24 is formed on the third insulating layer 33 by a semi-additive process similar to that described with reference to FIGS. 8A to 8D. The fourth wiring layer 24 is connected to the third wiring layer 23 and the connection terminals 42 of the first semiconductor chip 40 through via conductors in the third via holes VH3.

Similarly, then, a solder resist layer 34 is formed on the third insulating layer 33 as shown in FIG. 13B. The solder resist layer 34 is formed with openings 34a on connecting portions of the fourth wiring layer 24.

Figure 14:
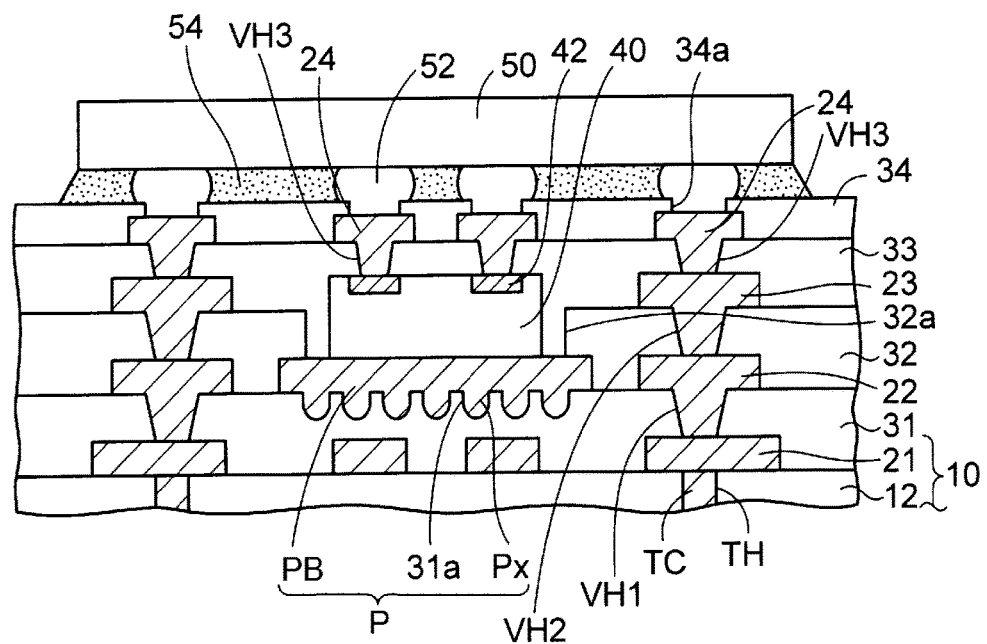
FIG. 14 is a section view (No. 3) showing the method for manufacturing the electronic component device by using the wiring board of FIG. 11B.

As shown in FIG. 14, then, a second semiconductor chip 50 is prepared as a second electronic component. The second semiconductor chip 50 includes bump electrodes 52. The bump electrodes 52 are placed on the connecting portions of the fourth wiring layer 24 through solders.

Thereafter, reflow heating is performed. Thereby, the bump electrodes 52 of the second semiconductor chip 50 are soldered to the connecting portions of the fourth wiring layer 24 to form a flip-chip connection.

As described above, since the electronic-component mounting pad P includes the plural protrusion portions Px provided on the pad body PB, the electronic-component mounting pad P has a relatively large volume. Therefore, in forming the opening 32a by a laser in the second insulating layer 32 disposed on the electronic-component mounting pad P, thermal damage which is caused by the laser and which is applied to the electronic-component mounting pad P is reduced.

Since the electronic-component mounting pad P includes the protrusion portions Px, the electronic-component mounting pad P is formed on the first insulating layer 31 with high adhesion property provided by the anchor effect.

Even if heat treatment is performed in the above-described step of connecting the second semiconductor chip 50, it is prevented that the electronic-component mounting pad P separates from the underlying first insulating layer 31.

Thereafter, a gap between the second semiconductor chip 50 and the solder resist layer 34 is filled with an underfill resin 54.

Figure 15:
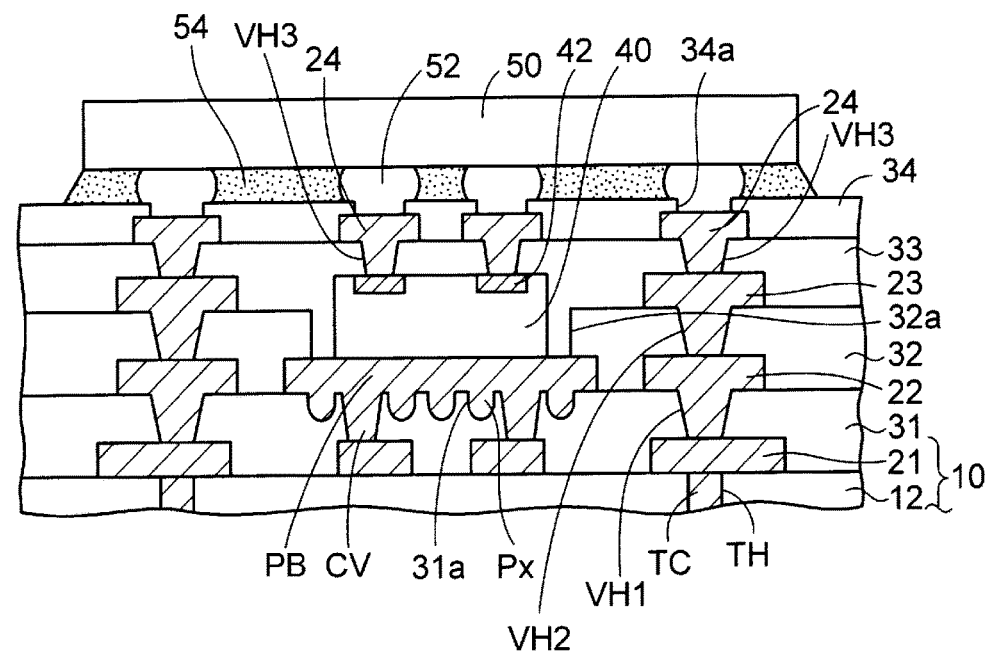
FIG. 15 is a section view showing a modification of a wiring board shown in FIG. 14.

As shown in a modification example of FIG. 15, while the protrusion portions Px are formed on the pad body PB, connection vias CV made of a conductor are formed. The electronic-component mounting pad P and the first wiring layer 21 may be connected to each other through the connection vias CV. The other elements of FIG. 15 are identical with those of FIG. 14.

In the case where the connection vias CV are formed under the electronic-component mounting pad P as in the modification of FIG. 15, in the step of forming the first via holes VH1 and the recess portions 31a (see FIG. 5C), other via holes for formation of the connection vias CV may be formed simultaneously.

Figure 16:
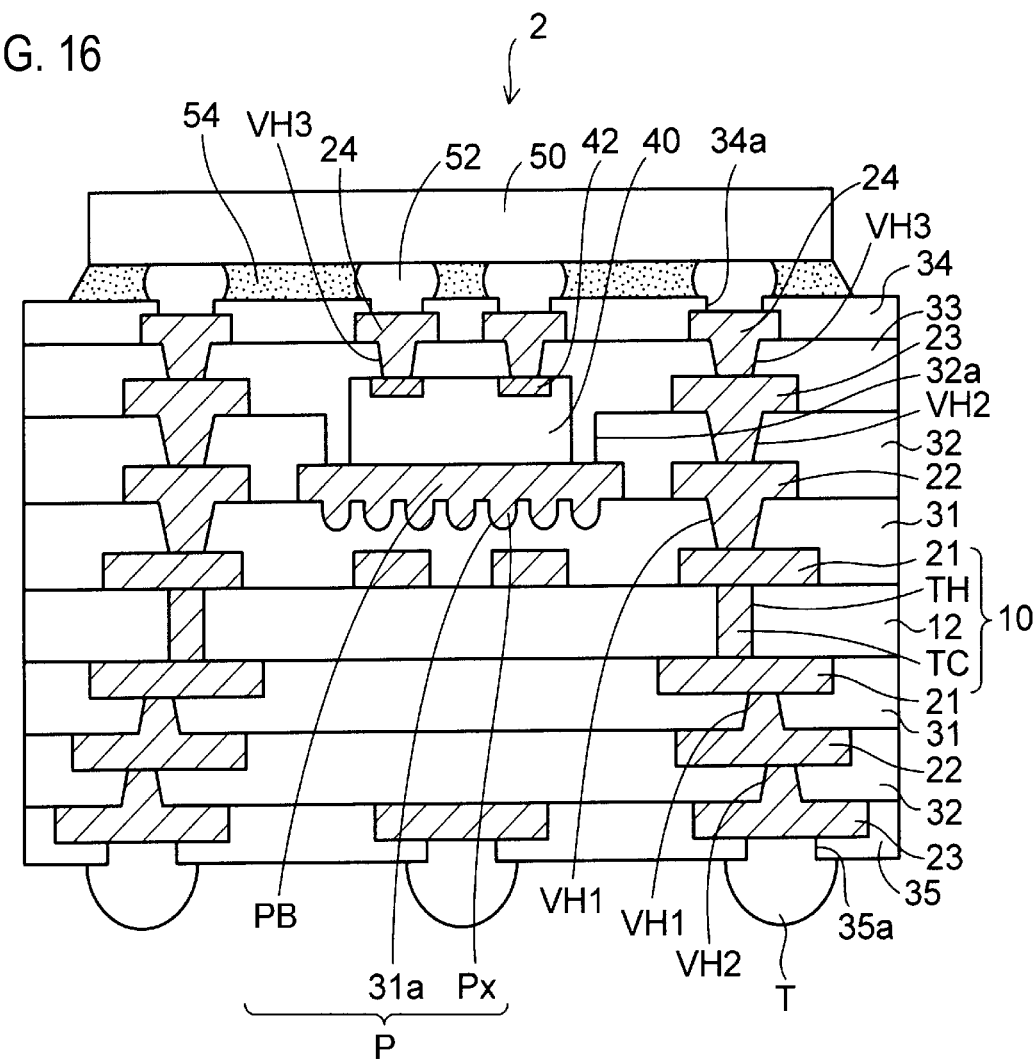
FIG. 16 is a section view showing the electronic component device of the first exemplary embodiment.

FIG. 16 shows an electronic component device 2 of the first exemplary embodiment which is manufactured by using the structure member of FIG. 14 based on the above-described manufacturing method.

As shown in FIG. 16, in the process of the above-described manufacturing method, the first insulating layer 31, the second wiring layer 22, the second insulating layer 32, the third wiring layer 23, and a solder resist layer 35 are further formed on the first wiring layer 21 on the lower surface side of the core board 10.

In the case where a large board for manufacturing multiple products is used as the core board 10, the wiring board is divided into individual electronic component devices.

As shown in FIG. 16, the electronic component device 2 of the first exemplary embodiment includes the core board 10 in an intermediate portion in the thickness direction of the electronic component device 2. The first wiring layers 21 are formed on the both surfaces of the core board 10 as described with reference to FIG. 4. The first insulating layers 31 are formed on the both surface sides of the core board 10, respectively. The first via holes VH1 are formed in the first insulating layers 31 on the both surface sides of the core board 10. The first via holes VH1 reach the first wiring layers 21.

The second wiring layers 22 are formed on the first insulating layers 31 on the both surface sides of the core board 10. The second wiring layers 22 are connected to the first wiring layers 21 through the via conductors provided in the first via holes VH1.

The electronic-component mounting pad P is disposed in the pad formation region "A" (see FIGS. 5A, 5B and 7A) of the first insulating layer 31 on the upper surface side of the core board 10. The electronic-component mounting pad P is formed on the first insulating layer 31 in a region where the first insulating layer 31 overlaps the first wiring layer 21 in a plan view.

The electronic-component mounting pad P includes the pad body PB and the plural protrusion portions Px. The plural protrusion portions Px protrude from the pad body PB in the thickness direction of the first insulating layer 31. The pad body PB of the the electronic-component mounting pad P and the second wiring layer 22 on the upper surface side of the core board 10 are located on the same plane.

The protrusion portions Px of the electronic-component mounting pad P is separate from the first wiring layer 21 and extends to the midway point of the first insulating layer 31 in the thickness direction of the first insulating layer 31. Thus, the protrusion portions Px do not reach the first wiring layer 21. In this way, the first insulating layer 31 is disposed between the protrusion portions Px of the electronic-component mounting pad P and the first wiring layer 21. Also, the electronic-component mounting pad P is electrically insulated from the other wiring layers.

Alternatively, as described in the modification example of FIG. 15, the electronic-component mounting pad P may be connected to the first wiring layer 21 through the connection vias CV.

The second insulating layer 32 is formed on the first insulating layer 31 on the upper surface side of the core board 10. The second insulating layer 32 is formed with the opening 32a and the second via holes VH2. The opening 32a is located on the electronic-component mounting pad P. The second via holes VH2 reach the second wiring layer 22.

The first semiconductor chip 40 is disposed on the electronic-component mounting pad P and in the opening 32a of the second insulating layer 32, in a state where the connection terminals 42 are directed upward. The third wiring layer 23 is formed on the second insulating layer 32. The third wiring layer 23 is connected to the second wiring layer 22 through the second via holes VH2.

Also, the third insulating layer 33 is formed on the second insulating layer 32 on the upper surface side of the core board 10. The third via holes VH3 are formed in the third insulating layer 33. The third via holes VH3 reach the connection terminals 42 of the first semiconductor chip 40 and the second wiring layer 22, respectively.

The fourth wiring layer 24 is formed on the third insulating layer 33. The fourth wiring layer 24 is connected to the connection terminals 42 of the first semiconductor chip 40 and the third wiring layer 23, through the third via holes VH3. The solder resist layer 34 is formed on the third insulating layer 33. The solder resist layer 34 is formed with openings 34a on the connecting portions of the fourth wiring layer 24.

The bump electrodes 52 of the second semiconductor chip 50 are flip-chip connected to the connecting portions of the fourth wiring layer 24. The gap between the second semiconductor chip 50 and the solder resist layer 34 is filled with the underfill resin 54.

On the other hand, the second insulating layer 32 is formed on the first insulating layer 31 on the lower surface side of the core board 10. The second insulating layer 32 is formed with the second via holes VH2. The second via holes VH2 reach the second wiring layer 22. The third wiring layer 23 is formed on the second insulating layer 32 on the lower surface side of the core board 10. The third wiring layer 23 is connected to the second wiring layer 22 through the via conductors provided in the second via holes VH2.

Furthermore, the solder resist layer 35 is formed on the second insulating layer 32 on the lower surface side of the core board 10. The solder resist layer 35 is formed with openings 35a on connecting portions of the third wiring layer 23.

External connection terminals T are provided on the connecting portions of the third wiring layer 23 on the lower surface side of the core board 10. External connection terminals T are made of a solder ball or the like.

As a result, the electronic component device 2 of the first exemplary embodiment has the structure that the first semiconductor chip 40 is mounted on the electronic-component mounting pad P of the wiring board 1.

In the electronic component device 2 of the first exemplary embodiment, as described above, since the electronic-component mounting pad P includes the plural protrusion portions Px protruding from the pad body PB, the electronic-component mounting pad P has a relatively large volume. Therefore, thermal damage which is received by the electronic-component mounting pad P in forming the opening 32a in the second insulating layer 32 by the laser can be reduced.

Since the electronic-component mounting pad P includes the protrusion portions Px, the electronic-component mounting pad P is formed on the first insulating layer 31 with high adhesion property provided by the anchor effect.

Therefore, when heat treatment is performed in the step of connecting the second semiconductor chip 50, it is prevented that the electronic-component mounting pad P separates from the first insulating layer 31.

Also, in the case where the electronic-component mounting pad P shown in FIGS. 9A and 9B described above is employed, the electronic-component mounting pad P includes the integrated protrusion portion Px on the pad body PB. The concavities and convexities C are formed on the lower surface of the integrated protrusion portion Px. Therefore, similar effects are achieved.

Although the semiconductor chips are exemplarily used as the electronic components, various other electronic components selected from capacitor elements, resistor elements, inductor elements, and the like may be mounted on the wiring board.

(Second Exemplary Embodiment)

FIGS. 17A to 24 are views showing a wiring board and an electronic component device according to a second exemplary embodiment.

In the second exemplary embodiment, a counter measure is taken so that no trouble occurs even in the case where, when an opening is formed by a laser in an insulating layer on an electronic-component mounting pad, the opening is deviates from the electronic-component mounting pad.

Figure 17A:
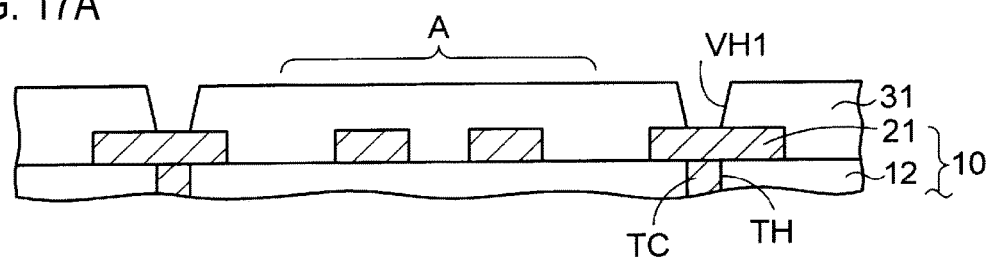
FIGS. 17A and 17B are section views (No. 1) showing a method for manufacturing a wiring board of a second exemplary embodiment.

In a method for manufacturing a wiring board of the second exemplary embodiment, at first, a structure member is prepared as shown in FIG. 17A. It is noted that this structure member is identical with that shown in FIG. 5B of the first exemplary embodiment.

Figure 17B:
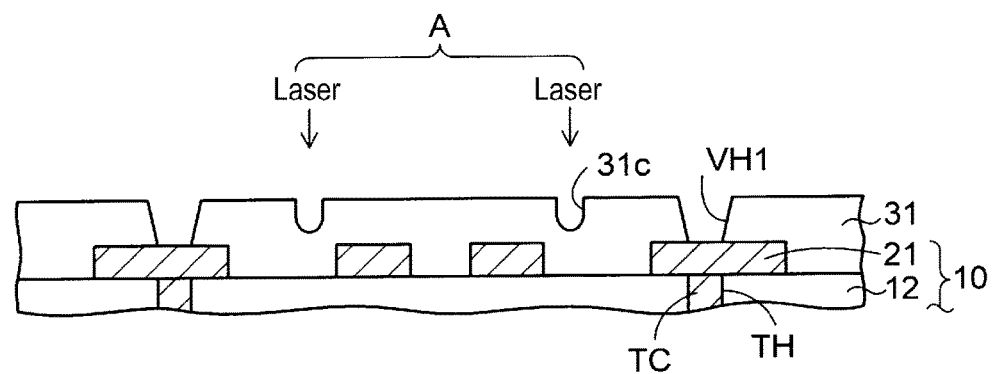
Figure 17C:
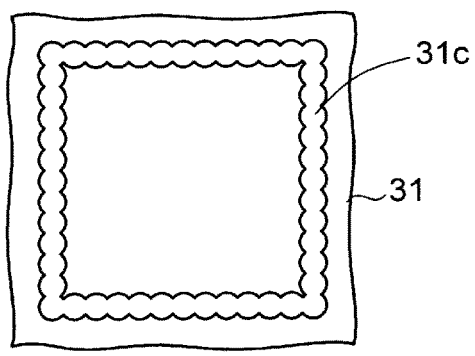
FIG. 17C is a partial plan view showing the structure of FIG. 17B when viewed from above.

As shown in FIGS. 17B and 17C, next, the first insulating layer 31 in the pad formation region A is processed with a laser to form a recess portion 31c having a rectangular frame in a plan view. Referring to FIG. 17C which is a partial plan view, a peripheral portion of the first insulating layer 31 in the pad formation region "A" is sequentially processed with the laser so that laser shots partially overlap each other. Therefore, the plural shot portions formed in the laser process are connected to each other, so that the rectangular frame-like recess portion 31c is formed in the first insulating layer 31.

Figure 18A:
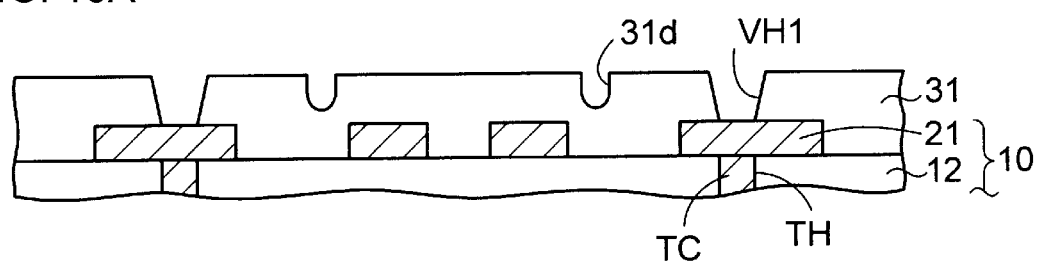
FIG. 18A is a section view (No.2) showing the method for manufacturing the wiring board of the second exemplary embodiment.
Figure 18B:
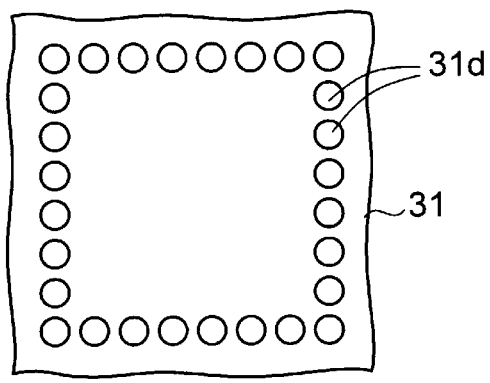
FIG. 18B is a partial plan view showing the structure of FIG. 18A when viewed from above.

Alternatively, as shown in FIG. 18B which is a partial plan view, the laser process may be performed so that recess portions 31d which are separate from each other with gaps therebetween are juxtaposed in lateral directions (horizontal directions), in a rectangular frame region at a peripheral portion of the first insulating layer 31.

Figure 19A:
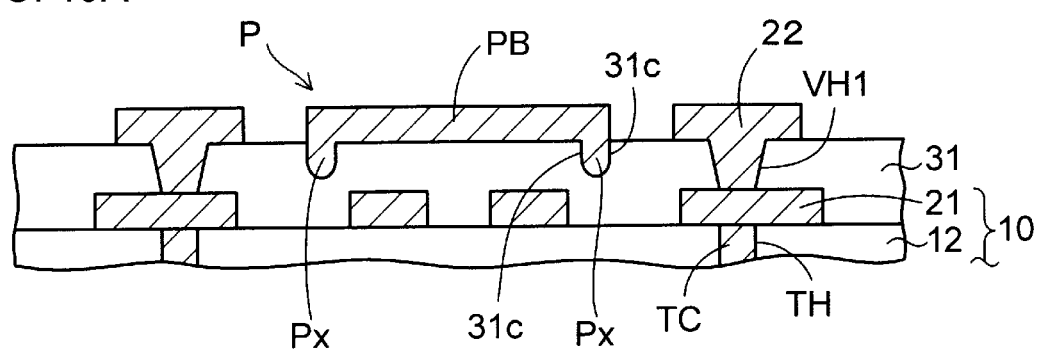
FIG. 19A is a section view (No. 3) showing the method for manufacturing the wiring board of the second exemplary embodiment.
Figure 19B:
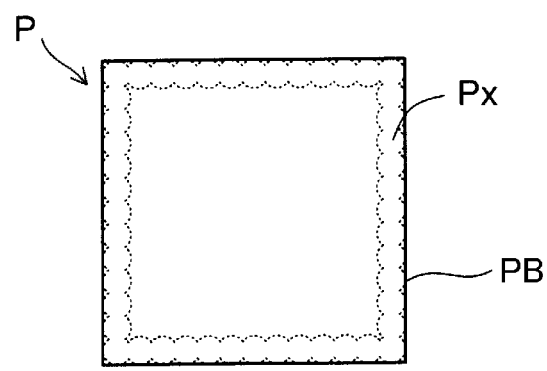
FIG. 19B is a partial plan view showing the structure of FIG. 19A when viewed from above.

As shown in FIGS. 19A and 19B, next, the second wiring layer 22 and the electronic-component mounting pad P are formed on the first insulating layer 31 shown in FIGS. 17B and 17C. The second wiring layer 22 is formed by a method similar to the method for forming the second wiring layer 22 and the electronic-component mounting pad P as shown in FIGS. 8A to 8C. The second wiring layer 22 is connected to the first wiring layer 21 through the via conductors provided in the first via holes VH1.

The electronic-component mounting pad P is formed to fill the rectangular frame-like recess portion 31c. Therefore, the electronic-component mounting pad P is formed so as to include a protrusion portion Px on the pad body PB. The protrusion portion Px protrudes in the thickness direction of the first insulating layer 31. The protrusion portion Px is embedded in the first insulating layer 31. The protrusion portion Px is formed in a peripheral region on the lower surface of the pad body PB. The protrusion portion Px has a rectangular frame-like shape in a plan view, so as to correspond to the rectangular frame-like recess portion 31c.

Figure 20A:
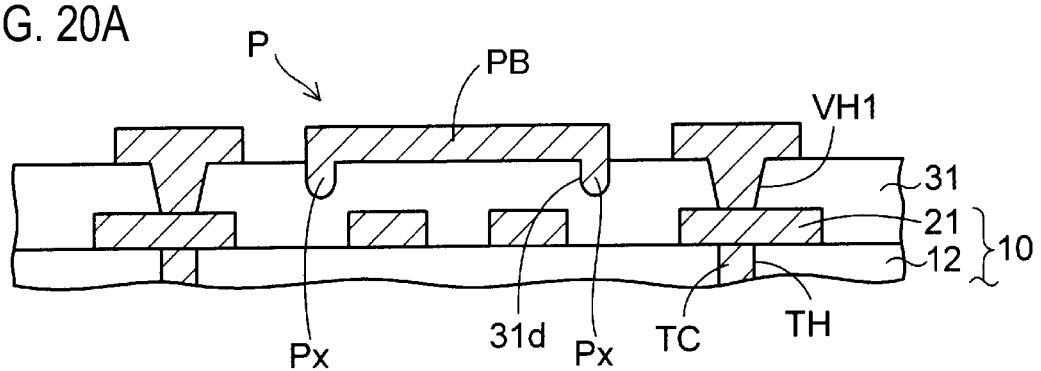
FIG. 20A is a section view (No. 4) showing the method for manufacturing the wiring board of the second exemplary embodiment.
Figure 20B:
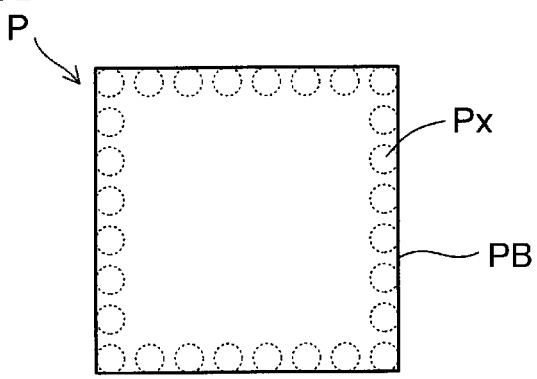
FIG. 20B is a partial plan view showing the structure of FIG. 20A when viewed from above.

FIGS. 20A and 20B (partial plan view) show the case where the recess portions 31d shown in FIGS. 18A and 18B are employed. The recess portions 31d are separate from each other with the gaps therebetween. In this case, plural protrusion portions Px are formed in a rectangular frame region at the peripheral portion of the lower surface of the pad body PB. The protrusion portions Px are juxtaposed in a state with being separate from each other.

Hereinafter, a method for manufacturing a wiring board by using the structure member of FIGS. 19A and 19B will be described.

Figure 21A:
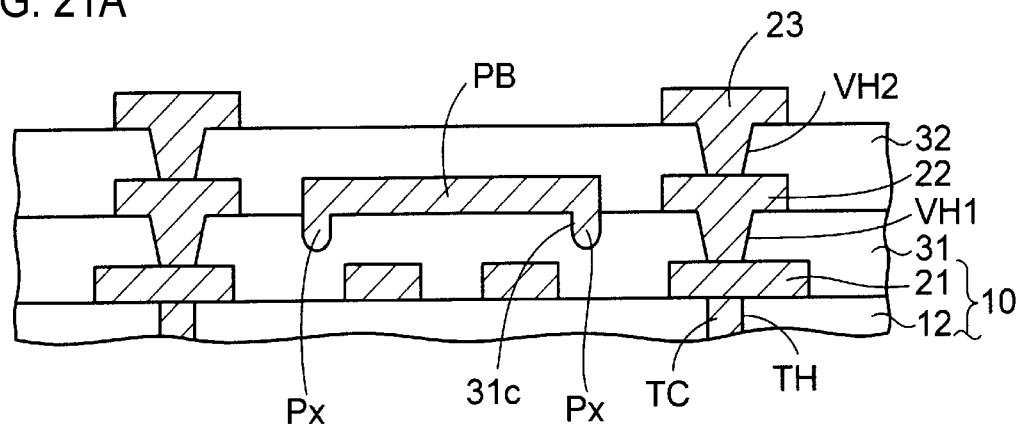
FIGS. 21A and 21B are section views (No. 5) showing the method for manufacturing the wiring board of the second exemplary embodiment.

As shown in FIG. 21A, next, steps similar to those of the first exemplary embodiment shown in FIGS. 10A to 11A are performed. As a result, the second insulating layer 32 is formed on the first insulating layer 31. The second insulating layer 32 is formed with the second via holes VH2. The second via holes VH2 reach the second wiring layer 22. Furthermore, the third wiring layer 23 is formed on the second insulating layer 32. The third wiring layer 23 is connected to the first wiring layer 21 through the second via holes VH2.

Figure 21B:
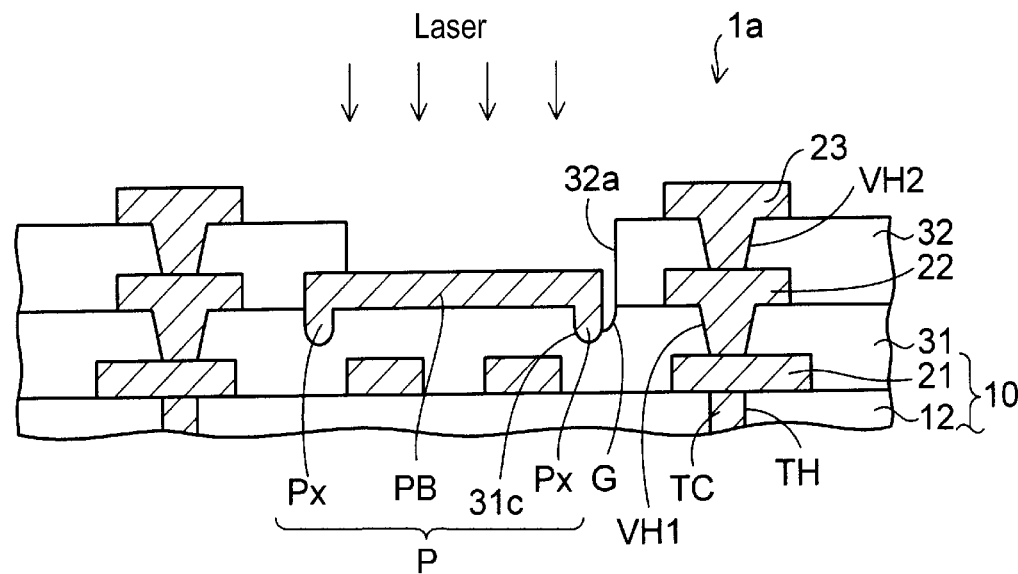

As shown in FIG. 21B, the second insulating layer 32 is processed with a laser in a method similar to that of the first exemplary embodiment shown in FIG. 11B, to form the opening 32a on the electronic-component mounting pad P.

As described in the preliminary matters, in the case where the distance between a side surface of the pad body PB of the electronic-component mounting pad P and a side wall of the opening 32a is narrowed, there may be a case where the side wall of the opening 32a is deviated toward the outside from the side surface of the pad body PB of the electronic-component mounting pad P due to positional misalignment in the laser process.

In the portion where the side wall of the opening 32a is deviated from the pad body PB, therefore, a groove G is formed by the laser in a range from the second insulating layer 32 in a region outside the side surface of the pad body PB to the first insulating layer 31, as shown in FIG. 21B.

In the second exemplary embodiment, however, the rectangular frame-like protrusion portion Px is formed in the peripheral portion of the lower surface of the pad body PB. Therefore, a bottom portion of the groove G is located next to the outer wall of the protrusion portion Px of the electronic-component mounting pad P.

Even if wet treatment such as desmear treatment is performed for the structure member shown in FIG. 21B, therefore, treatment liquid does not penetrate into the inner side of the lower surface of the pad body PB. Consequently, it is prevented that the electronic-component mounting pad P peels off from the first insulating layer 32.

As a result, a wiring board 1a of the second exemplary embodiment is obtained as shown in FIG. 21B. The wiring board 1a of the second exemplary embodiment has a structure that the electronic-component mounting pad P that includes the rectangular frame-like protrusion portion Px at the peripheral portion of the lower surface of the pad body PB is exposed from the opening 32a of the second insulating layer 32.

As described above, in order to prevent the treatment liquid from penetrating into the lower surface of the electronic-component mounting pad P from occurring, a protrusion length of the protrusion portion Px of the electronic-component mounting pad P is set to be larger than a depth of the groove G formed in the first insulating layer 31.

In the case where the protrusion portions Px of the electronic-component mounting pad P are separate from each other as shown in FIGS. 20A and 20B, the treatment liquid may partially penetrate through gaps between the protrusion portions Px of the electronic-component mounting pad P into the lower surface of the pad body PB.

However, the protrusion portions Px of the electronic-component mounting pad P function as anchors to provide an adhesion property with the first insulating layer 31. Therefore, even if the treatment liquid partially penetrates into the lower surface of the pad body PB, peeling off of the electronic-component mounting pad P does not occur.

Next, a method for manufacturing an electronic component device by using the wiring board 1a of the second exemplary embodiment shown in FIG. 21B will be described.

Figure 22A:
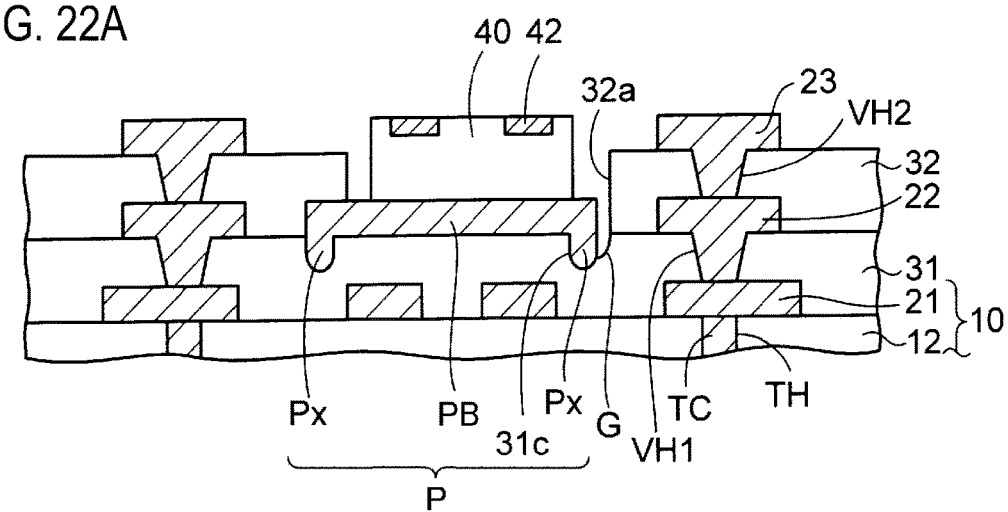
FIGS. 22A and 22B are section views (No. 1) showing a method for manufacturing an electronic component device by using the wiring board of FIG. 21B.

As shown in FIG. 22A, the first semiconductor chip 40 is mounted on the electronic-component mounting pad P in a similar manner to the step, shown in FIG. 12A, of the first exemplary embodiment.

Figure 22B:
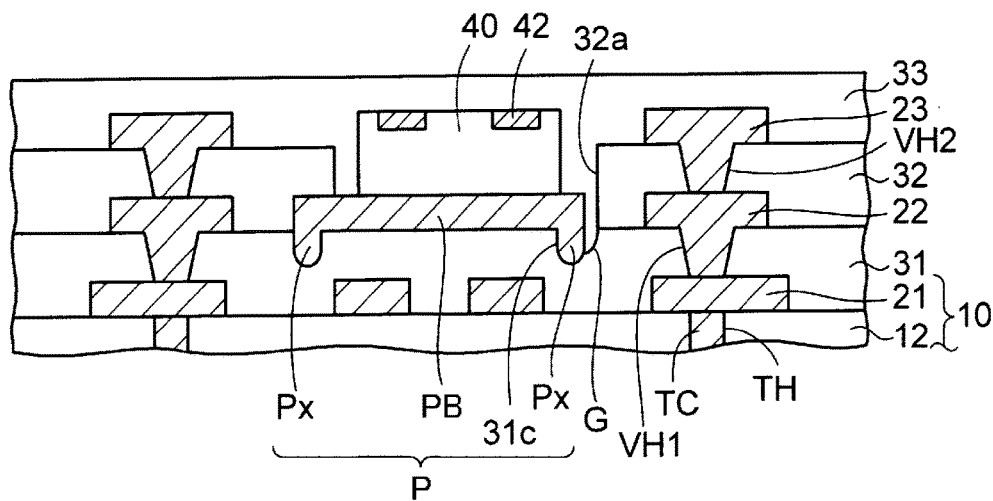

As shown in FIG. 22B, furthermore, the third insulating layer 33 is formed on the second insulating layer 32 in a similar manner to the step, shown in FIG. 12B, of the first exemplary embodiment. The third insulating layer 33 covers the second wiring layer 22 and the first semiconductor chip 40.

At this time, in pressing an uncured resin film while heating so as to form the third insulating layer 33, the resin film is fluidized, and the groove G outside the first semiconductor chip 40 is filled with the resin. As a result, an upper surface of the resin film is flattened. In this way, even if the opening 32a of the second insulating layer 32 is deviated from the pad body PB of the electronic-component mounting pad P due to positional misalignment in the laser process, no trouble occurs.

Figure 23:
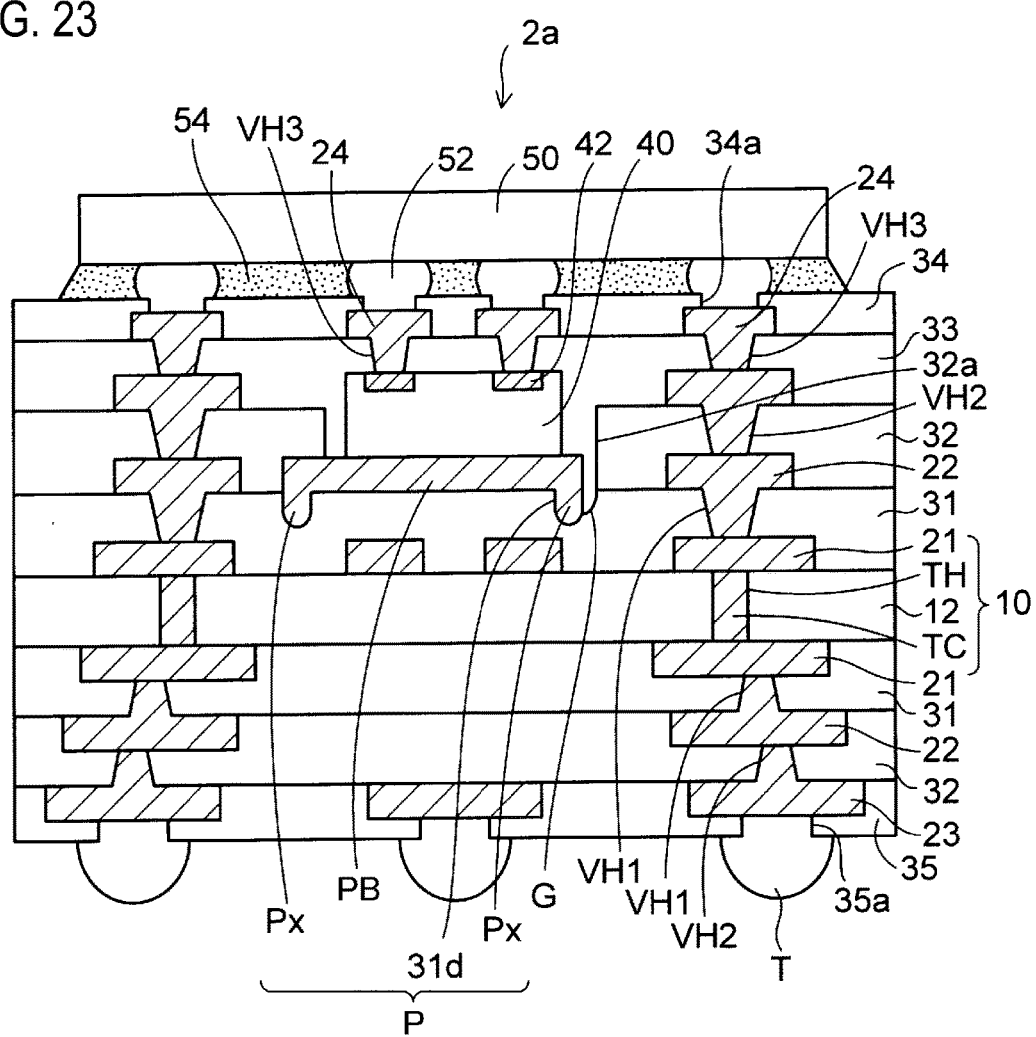
FIG. 23 is a section view showing the electronic component device of the second exemplary embodiment.

As shown in FIG. 23, next, the steps, shown in FIGS. 13A to 16, of the first exemplary embodiment are performed. Thereby, an electronic component device 2a of the second exemplary embodiment is obtained.

The electronic component device 2a of the second exemplary embodiment is different from the electronic component device 2 of the first exemplary embodiment in that the rectangular frame-like protrusion portion Px is formed in the peripheral portion of the lower surface of the pad body PB of the electronic-component mounting pad P. The second exemplary embodiment exemplifies the case where the opening 32a of the second insulating layer 32 is deviated from the pad body PB of the electronic-component mounting pad P due to positional misalignment in the laser process.

It is a matter of course that the opening 32a of the second insulating layer 32 may be provided without deviation in the upper surface of the electronic-component mounting pad P which includes the rectangular frame-like protrusion portion Px on the lower surface.

The elements other than those described above are identical with those of the electronic component device 2 of the first exemplary embodiment. Therefore, the other elements are denoted by the same reference numerals, and description thereon is omitted.

In the wiring board 1a and electronic component device 2a of the second exemplary embodiment, even if the opening 32a of the second insulating layer 32 is deviated from the pad body PB of the electronic-component mounting pad P due to positional misalignment in the laser process, it is prevented that wet treatment peels off the electronic-component mounting pad P.

Figure 24:
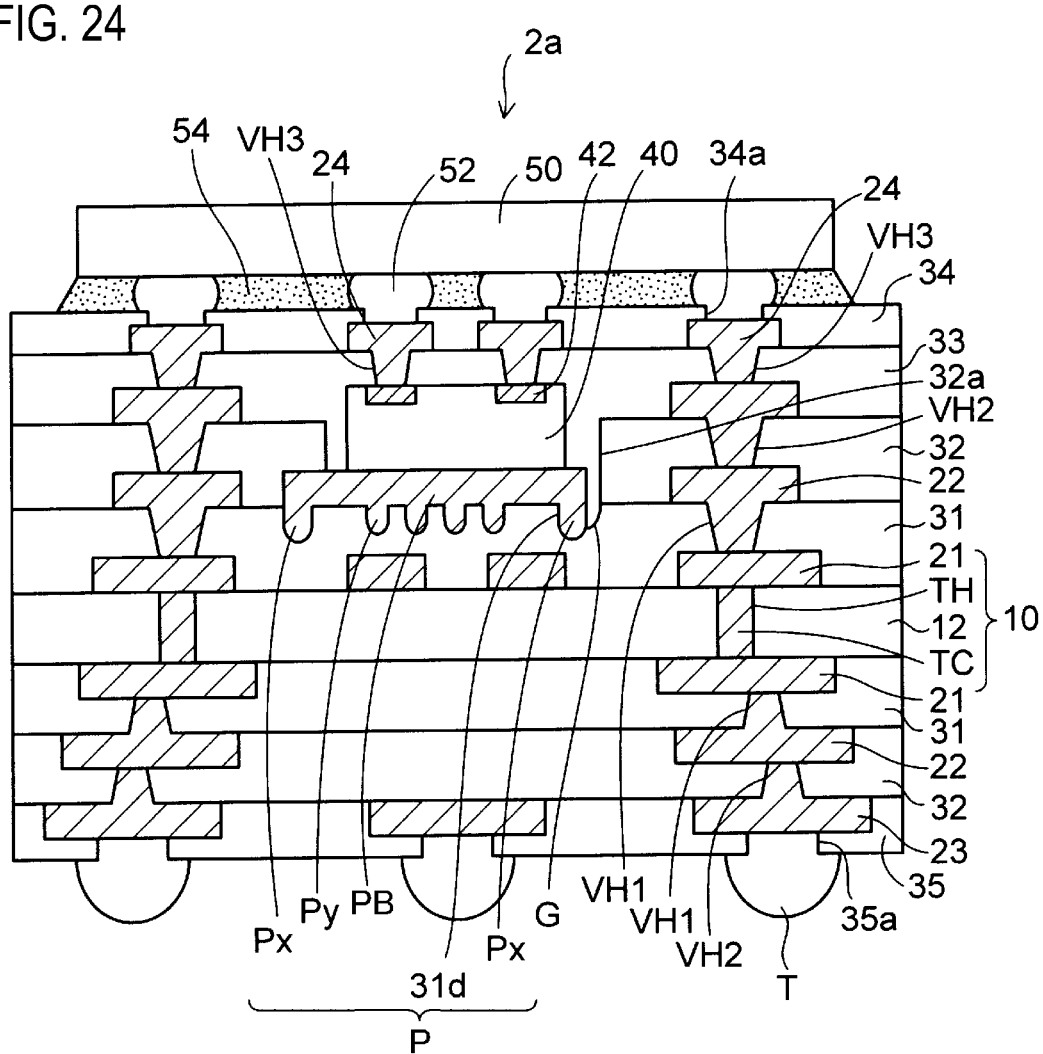
FIG. 24 is a section view showing an electronic component device of a modification of the second exemplary embodiment.

As shown in FIG. 24 (a modification example), while the rectangular frame-like protrusion portion Px are formed in the peripheral portion of the lower surface of pad body PB, plural other protrusion portions Py may be formed in a center portion of the lower surface of the pad body PB. A protrusion length of the other protrusion portions Py may be equal to or different from that of the frame-like protrusion portion Px. The other elements shown in FIG. 24 are identical with those shown in FIG. 23.

In the case where the other protrusion portions Py are formed on the pad body PB of the electronic-component mounting pad P as in the modification example of FIG. 24, other recess portions for forming the other protrusion portions Py may be simultaneously formed in the steps of forming the first via holes VH1 and the recess portions 31d shown in FIGS. 17A and 17B.

[Clauses]
This disclosure further encompasses various exemplary embodiments, for example, described below.
1. A method for manufacturing a wiring board, the method comprising:
   forming an insulating layer on a first wiring layer;
   forming recess portions in an upper surface of the insulating layer in a region where the insulating layer overlaps the first wiring layer in a plan view; and
   forming a pad on the insulating layer, wherein
   the pad comprises
      a pad body, and
      plural protrusions that protrude from the pad body toward a lower side of the pad body and that are separate from the first wiring layer, and
   the protrusion portions fill the recess portions.
2. The method of the clause 1, wherein
   in the forming the recess portions,
      the recess portions are formed in the insulating layer by a laser, and
      via holes that reach the first wiring layer are formed in the insulating layer by the laser, and
   in the forming the pad, a second wiring layer that is connected to the first wiring layer through via conductors in the via holes is simultaneously formed.
3. A method for manufacturing an electronic component, comprising:
   forming a first insulating layer on a first wiring layer;
   forming recess portions in an upper surface of the first insulating layer in a region where the first insulating layer overlaps the first wiring layer in a plan view;
   forming a pad on the first insulating layer, the pad comprising
      a pad body, and
      plural protrusions that protrude from the pad body toward a lower side of the pad body and that are separate from the first wiring layer,
   the protrusion portions filling the recess portions;
   forming a second insulating layer on the first insulating layer, the second insulating layer being formed with an opening; and
   mounting an electronic component on the pad.

What is claimed is:
1. A wiring board comprising:
   a first wiring layer;
   an insulating layer formed on the first wiring layer; and
   a pad for mounting an electronic component thereon, the pad formed on the insulating layer in a region where the insulating layer overlaps the first wiring layer in a plan view,
   wherein the pad comprises
      a pad body, and
      plural protrusion portions that protrude from a lower side of the pad body toward the first wiring layer, wherein the plural protrusion portions are embedded in the insulating layer and are separate from the first wiring layer, and wherein the plural protrusion portions are disposed in a peripheral portion of the pad body and are connected to each other to define a frame shape in a plan view, with adjacent protrusion portions of the plural protrusion portions directly contacting each other along outer walls thereof.
2. The wiring board according to claim 1, further comprising:
   a second wiring layer; and
   via conductors, wherein
   the insulating layer is formed with via holes that reach the first wiring layer, the via conductors are provided in the first via holes,
the second wiring layer is formed on the insulating layer,
the second wiring layer is connected to the first wiring layer through the via conductors provided in the via holes, and
the second wiring layer is disposed on a same plane as the pad is.

3. The wiring board according to claim 1, further comprising:
connection vias through which the pad and the first wiring layer are connected to each other.

4. The wiring board according to claim 1, wherein a length of the protrusion portions in a thickness direction of the insulating layer is smaller than that of the via conductors.

5. The wiring board according to claim 1, wherein the pad is electrically insulated from the first wiring layer.

6. The wiring board according to claim 1, wherein the plural protrusion portions are spaced from the first wiring layer.

7. An electronic component device comprising:
a first wiring layer;
a first insulating layer formed on the first wiring layer;
a pad formed on the first insulating layer in a region where the insulating layer overlaps the first wiring layer in a plan view, the pad comprising
a pad body, and
plural protrusion portions that protrude from a lower side of the pad body toward the first wiring layer, wherein the plural protrusion portions are embedded in the first insulating layer and are separate from the first wiring layer, and wherein the plural protrusion portions are disposed in a peripheral portion of the pad body and are connected to each other to define a frame shape in a plan view, with adjacent protrusion portions of the plural protrusion portions directly contacting each other along outer walls thereof;
a second insulating layer that is formed on the first insulating layer, the second insulating layer being formed with an opening on the pad; and
an electronic component provided on the pad.

8. The electronic component device according to claim 7, further comprising:
a second wiring layer; and
first via conductors, wherein
the first insulating layer is formed with first via holes that reach the first wiring layer,
the first via conductors are provided in the first via holes,
the second wiring layer is formed on the first insulating layer,
the second wiring layer is connected to the first wiring layer through the first via conductors, and
the second wiring layer is disposed on a same plane as the pad is.

9. The electronic component device according to claim 8, wherein a length of the protrusion portions in a thickness direction of the first insulating layer is smaller than that of the first via conductors.

10. The electronic component device according to claim 7, further comprising:
a third insulating layer that is formed on the second insulating layer and that covers the electronic component;
a third wiring layer that is formed on the third insulating layer; and
second via conductors, wherein
the third insulating layer is formed with second via holes that reach connection terminals of the electronic component,
the second via conductors are provided in the second via holes, and
the third wiring layer is connected to the connection terminals of the electronic component through the second conductors.

11. The electronic component device according to claim 7, wherein the pad is electrically insulated from the first wiring layer.

12. The electronic component device according to claim 7, wherein the plural protrusion portions are spaced from the first wiring layer.

* * * * *